US012757488B2

(12) United States Patent
Kang et al.

(10) Patent No.: US 12,757,488 B2
(45) Date of Patent: Oct. 6, 2026

(54) THIN FILM TRANSISTOR SUBSTRATE AND DISPLAY DEVICE COMPRISING THE SAME

(71) Applicant: LG Display Co., Ltd., Seoul (KR)

(72) Inventors: Min-Gu Kang, Paju-si (KR); Younghyun Ko, Paju-si (KR); HongRak Choi, Paju-si (KR)

(73) Assignee: LG Display Co., Ltd., Seoul (KR)

(*) Notice: Subject to any disclaimer, the term of this patent is extended or adjusted under 35 U.S.C. 154(b) by 1000 days.

(21) Appl. No.: 17/970,576

(22) Filed: Oct. 21, 2022

(65) Prior Publication Data

US 2023/0127842 A1 Apr. 27, 2023

(30) Foreign Application Priority Data

Oct. 21, 2021 (KR) ........................ 10-2021-0140722

(51) Int. Cl.
*H10D 86/60* (2025.01)
*H10D 86/40* (2025.01)
*H10K 59/121* (2023.01)

(52) U.S. Cl.
CPC ........... *H10D 86/60* (2025.01); *H10D 86/423* (2025.01); *H10D 86/481* (2025.01); *H10K 59/1213* (2023.02)

(58) Field of Classification Search
CPC ....... H10D 86/60; H10D 86/481; H10D 86/42
See application file for complete search history.

(56) References Cited

U.S. PATENT DOCUMENTS 11,521,552 B2 * 12/2022 Park .................. H10D 30/6755
2015/0123084 A1 5/2015 Kim et al.
2017/0338252 A1 11/2017 Lee et al.
2018/0061868 A1 3/2018 Na et al.
2018/0076238 A1 3/2018 Lim et al.
(Continued)

FOREIGN PATENT DOCUMENTS

CN 108269852 A 7/2018
CN 110277427 A 9/2019
(Continued)

OTHER PUBLICATIONS

Office Action issued Dec. 19, 2023 for counterpart German Patent Application No. 102022127701.1 Note: CN 111755462 A, CN 113192985 A and EP 3840051 A1 were cited in a prior IDS.
(Continued)

*Primary Examiner* — Trang Q Tran
(74) *Attorney, Agent, or Firm* — Morgan, Lewis & Bockius LLP

(57) ABSTRACT

A thin film transistor substrate and a display device including the same are provided. The thin film transistor substrate includes a first thin film transistor and a second thin film transistor on a base substrate, wherein the first thin film transistor includes a first active layer on the base substrate, a first conductive material layer on the first active layer, and a first gate electrode spaced apart from the first active layer and at least partially overlapped with the first active layer, and the second thin film transistor includes a second active layer on the base substrate, a second conductive material layer on the second active layer, and a second gate electrode spaced apart from the second active layer and at least partially overlapped with the second active layer.

24 Claims, 16 Drawing Sheets

(56) References Cited

U.S. PATENT DOCUMENTS

| | | | | |
|---|---|---|---|---|
| 2018/0190683 | A1 | 7/2018 | Koo | |
| 2019/0288048 | A1 | 9/2019 | Kang et al. | |
| 2020/0090950 | A1 * | 3/2020 | Yamazaki | H10D 30/031 |
| 2020/0105799 | A1 * | 4/2020 | Yuan | H10D 86/481 |
| 2020/0135772 | A1 | 4/2020 | Lee | |
| 2020/0203534 | A1 * | 6/2020 | Park | H10D 30/031 |
| 2020/0212221 | A1 | 7/2020 | Baeck et al. | |
| 2021/0143189 | A1 | 5/2021 | Kim et al. | |
| 2021/0193045 | A1 | 6/2021 | Yang et al. | |
| 2021/0399024 | A1 | 12/2021 | Gong et al. | |
| 2023/0099934 | A1 | 3/2023 | Gong et al. | |
| 2023/0127842 | A1 | 4/2023 | Kang et al. | |

FOREIGN PATENT DOCUMENTS

| | | | |
|---|---|---|---|
| CN | 111725324 | A | 9/2020 |
| CN | 111755462 | A | 10/2020 |
| CN | 112002763 | A | 11/2020 |
| CN | 112786664 | A | 5/2021 |
| CN | 113193033 | A | 7/2021 |
| CN | 1131992985 | A | 7/2021 |
| DE | 10 2019 133 982 | A1 | 7/2020 |
| DE | 102022127701 | A1 | 4/2023 |
| EP | 3840051 | A1 | 6/2021 |
| KR | 10-2015-0051824 | A | 5/2015 |
| KR | 10-2019-0108220 | A | 9/2019 |
| KR | 10-2020-0016058 | A | 2/2020 |
| KR | 2020-0048910 | A | 5/2020 |
| KR | 10-2021-0081710 | A | 7/2021 |
| KR | 10-2864042 | B1 | 9/2025 |
| WO | 2019/187102 | A1 | 10/2019 |
| WO | 2020/238557 | A1 | 12/2020 |

OTHER PUBLICATIONS

Combined Search and Examination report dated Mar. 14, 2023 issued in corresponding UK Patent Application No. GB2213799.6.

Office Action issued in corresponding Korean Patent Application No. 10-2021-014722, dated Oct. 31, 2024.

* cited by examiner

THIN FILM TRANSISTOR SUBSTRATE AND DISPLAY DEVICE COMPRISING THE SAME

CROSS-REFERENCE TO RELATED APPLICATIONS

This application claims the benefit of priority of the Korean Patent Application No. 10-2021-0140722 filed on Oct. 21, 2021.

BACKGROUND

Technical Field

The present disclosure relates to a thin film transistor substrate and a display device comprising the same, in which an active layer of a thin film transistor is used as a gate electrode of another thin film transistor.

Discussion of the Related Art

Since a thin film transistor may be fabricated on a glass substrate or a plastic substrate, thin film transistors have been widely used as a switching element or a driving element of a display device such as a liquid crystal display device or an organic light emitting device.

A thin film transistor may be categorized into an amorphous silicon thin film transistor in which amorphous silicon is used as an active layer, a polycrystalline silicon thin film transistor in which polycrystalline silicon is used as an active layer, or an oxide semiconductor thin film transistor in which an oxide semiconductor is used as an active layer, i.e. categorized based on a material constituting the active layer.

Since an oxide semiconductor thin film transistor (TFT) has high mobility and may have a large resistance change depending on oxygen content, the oxide semiconductor thin film transistor has an advantage in that desired properties may be easily obtained. Further, since an oxide constituting an active layer may be grown at a relatively low temperature during fabrication of the oxide semiconductor thin film transistor, the fabricating cost of the oxide semiconductor thin film transistor is reduced compared to fabricating some other semiconductor thin film transistors. Furthermore, in view of the properties of oxide, since an oxide semiconductor is transparent, it is easier to manufacture a transparent display. However, the oxide semiconductor thin film transistors have the disadvantage that stability and electron mobility are not as desirable when compared with a polycrystalline silicon thin film transistors.

Recently, with high quality and high resolution display devices, it has been possible to integrate a thin film transistor in the display device with high density. However, since a large number of thin film transistors are disposed in a limited area, a problem occurs in that a capacitor area is not sufficiently ensured/large enough. Therefore, in a display device comprising a plurality of thin film transistors, there is a need for a solution to secure the area of a capacitor by efficiently configuring and arranging the thin film transistor.

SUMMARY

Accordingly, embodiments of the present disclosure are directed to a thin film transistor substrate and a display device comprising the same that substantially obviate one or more of the problems due to limitations and disadvantages of the related art.

An aspect of the present disclosure is to provide a thin film transistor substrate and a display device comprising the same, in which a thin film transistor is efficiently disposed to more efficiently use a space.

Another aspect of the present disclosure is to provide a thin film transistor substrate and a display device comprising the same, in which an active layer of a thin film transistor is used as a gate electrode of another thin film transistor to enhance space efficiency and secure a sufficient capacitor area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a thin film transistor substrate comprises a first thin film transistor and a second thin film transistor on a base substrate, wherein the first thin film transistor includes a first active layer on the base substrate, a first conductive material layer on the first active layer, and a first gate electrode spaced apart from the first active layer and at least partially overlapped with or "by" the first active layer, the second thin film transistor including a second active layer on the base substrate, a second conductive material layer on the second active layer, and a second gate electrode spaced apart from the second active layer and at least partially overlapping with the second active layer, the first active layer being disposed between the base substrate and the second active layer, the second active layer being disposed between the first active layer and the second gate electrode, and the first gate electrode being disposed on the same layer as the second active layer.

The first gate electrode may include a first layer and a second layer on the first layer, the first layer of the first gate electrode being disposed on the same layer as the second active layer and including the same semiconductor material as that of the second active layer, and the second layer of the first gate electrode being disposed on the same layer as the second conductive material layer and including the same conductive material as that of the second conductive material layer.

The first layer of the first gate electrode may be integrally formed with the second active layer.

The second layer of the first gate electrode may be integrally formed with the second conductive material layer.

Each of the first and second conductive material layers may include at least one of titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO).

The first active layer may include a first channel portion, a first source connection portion connected to one side of the first channel portion, and a first drain connection portion connected to the other side of the first channel portion, and the first conductive material layer may be disposed on the first source connection portion and the first drain connection portion but may not be disposed on the first channel portion.

Each of the first source connection portion and the first drain connection portion may be disposed between the base substrate and the first conductive material layer.

Each of the first source connection portion and the first drain connection portion may be in contact with the first conductive material layer.

The second active layer may include a second channel portion, a second source connection portion connected to one side of the second channel portion, and a second drain connection portion connected to the other side of the second channel portion, and the second conductive material layer may be disposed on the second source connection portion and the second drain connection portion but may not be disposed on the second channel portion.

Each of the second source connection portion and the second drain connection portion may be disposed between the first active layer and the second conductive material layer.

Each of the second source connection portion and the second drain connection portion may be in contact with the second conductive material layer.

A portion of any one of the second source connection portion and the second drain connection portion may constitute the first layer of the first gate electrode.

The thin film transistor substrate may further comprise a first capacitor electrode or plate connected to any one of the first source connection portion and the first drain connection portion and a second capacitor electrode connected to any one of the second source connection portion and the second drain connection portion, wherein the first capacitor electrode and the second capacitor electrode may be spaced apart from each other and overlap each other to form a first capacitor.

The first capacitor electrode may include a first layer integrally formed with any one of the first source connection portion and the first drain connection portion, and a second layer integrally formed with the first conductive material layer, and the second capacitor electrode may include a first layer integrally formed with any one of the second source connection portion and the second drain connection portion, and a second layer integrally formed with the second conductive material layer.

The thin film transistor substrate may further comprise a third capacitor electrode disposed on the same layer as the second gate electrode, wherein the second capacitor electrode and the third capacitor electrode may be spaced apart from each other and overlap each other to form a second capacitor.

The second capacitor electrode may be disposed between the first capacitor electrode and the third capacitor electrode, and the third capacitor electrode may be connected to the first capacitor electrode.

The thin film transistor substrate may further comprise a shielding layer disposed on the same layer as the second gate electrode and overlapped with the first gate electrode.

Each of the first active layer and the second active layer may include an oxide semiconductor material.

The oxide semiconductor material may include at least one of an IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based, or FIZO(FeInZnO)-based oxide semiconductor material.

At least one of the first active layer or the second active layer may include a first oxide semiconductor layer, and a second oxide semiconductor layer on the first oxide semiconductor layer.

At least one of the first active layer or second active layer may further include a third oxide semiconductor layer on the second oxide semiconductor layer.

The first conductive material layer may not overlap the first gate electrode.

The second conductive material layer may not overlap the second gate electrode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
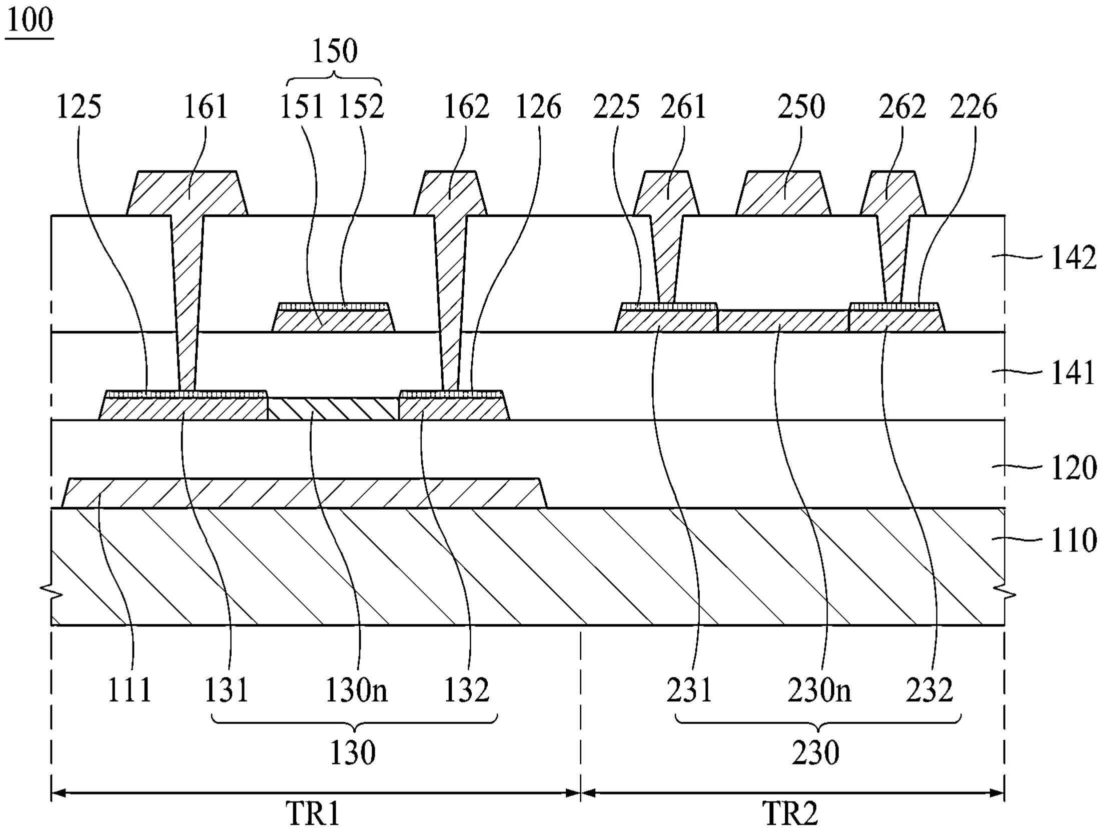
FIG. 1 is a cross-sectional view illustrating a thin film transistor substrate according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. The shape, a, ratio, angle, and numbers disclosed in the drawings for describing embodiments of the present disclosure are merely by way of example, and thus, the present disclosure is not limited to the illustrated details. Like reference numerals refer to like elements throughout the specification. In the following description, when the detailed description of a relevant known, or previously described function or configuration is determined to unnecessarily obscure part of the present disclosure, such detailed description will be omitted.

In a case where 'comprise', 'have', and 'include' are used, another part may be included unless 'only' is used, for example. The terms of a singular form may include plural forms unless reference is made to the contrary.

In construing an element, the element is construed as including an error range even when there is no explicit description.

In describing a position relationship, for example, when the position relationship is described as 'upon', 'above', 'below', and 'next to', one or more portions may be arranged between two other portions unless 'just' or 'direct' is used, for example.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used, foe example.

It will be understood that although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from one of the first item, the second item, and the third item; two or more of the first item, the second item, and the third item; as well as the first item, the second item, or the third item; for example.

Features of various embodiments of the present disclosure may be partially or overall coupled to or combined with each other, and may be variously inter-operated with each other and combined as those skilled in the art will understand. The embodiments of the present disclosure may be carried out independently from each other, or may be carried out together, or in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin film transistor substrate 100 according to one embodiment of the present disclosure.

The thin film transistor substrate 100 according to one embodiment of the present disclosure includes a first thin film transistor TR1 and a second thin film transistor TR2 on a base substrate 110.

Glass or plastic may be used as the base substrate 110. A transparent plastic, e.g., polyimide, which is to some degree flexible, may be used as the plastic. When the polyimide is used as the base substrate 110, a heat-resistant polyimide capable of enduring a high temperature may be used for when, as can be the case, a high temperature deposition process is performed on the base substrate 110.

A first light shielding layer 111 may be disposed on the base substrate 110. The first light shielding layer 111 shields light incident from the outside to protect the thin film transistors TR1 and TR2.

The first light shielding layer 111 may be made of a material having light shielding characteristics. The first light shielding layer 111 may include at least one of an aluminum-based metal such as aluminum (Al) or an aluminum alloy, a molybdenum-based metal such as molybdenum (Mo) or a molybdenum alloy, chromium (Cr), tantalum (Ta), neodymium (Nd), titanium (Ti) or iron (Fe). According to one embodiment of the present disclosure, the first light shielding layer 111 may be electrically conducting.

The first light shielding layer 111 may be electrically connected to any one of source electrodes 161 and 261 and drain electrodes 162 and 262 of the thin film transistors TR1 and TR2. In addition, the first light shielding layer 111 may be electrically connected to gate electrodes 150 and 250. The first light shielding layer 111 may be omitted.

A lower buffer layer (not shown) may be disposed between the base substrate 110 and the first light shielding layer 111. The lower buffer layer may protect active layers 130 and 230 by shielding the active layers from air and water, and may planarize an upper surface of the base substrate 110.

A buffer layer 120 is disposed on the first light shielding layer 111. The buffer layer 120 may be made of an insulating material. For example, the buffer layer 120 may include at least one of insulating materials such as a silicon oxide, a silicon nitride and a metal-based oxide. The buffer layer 120 may have a single layered structure, or may have a multi-layered structure.

The buffer layer 120 may protect the active layers 130 and 230 by shielding them from air and water. Also, an upper surface of the base substrate 110 on which the first light shielding layer 111 is disposed may be planarized by the buffer layer 120.

Referring to FIG. 1, the first thin film transistor TR1 and the second thin film transistor TR2 may be disposed on the buffer layer 120.

According to one embodiment of the present disclosure, the first thin film transistor TR1 includes a first active layer 130 on the base substrate 110, first conductive material layers 125 and 126 on the first active layer 130, and a first gate electrode 150 at least partially overlapped by the first active layer 130. The second thin film transistor TR2 includes a second active layer 230 on the base substrate 110, second conductive material layers 225 and 226 on the second active layer 230, and a second gate electrode 250 at least partially overlapped by the second active layer 230.

Referring to FIG. 1, the first active layer 130 is disposed on the buffer layer 120. The first conductive material layers 125 and 126 are disposed on the first active layer 130. The first conductive material layers 125 and 126 may be selectively disposed on a portion of the first active layer 130.

According to one embodiment of the present disclosure, the first active layer 130 may be formed of semiconductor material. The first active layer 130 may include, for example, an oxide semiconductor material.

The oxide semiconductor material may include at least one of, for example, an IZO(InZnO)-based, IGO(InGaO)-based, ITO(InSnO)-based, IGZO(InGaZnO)-based, IGZTO (InGaZnSnO)-based, GZTO(GaZnSnO)-based, GZO (GaZnO)-based, ITZO(InSnZnO)-based, or FIZO (FeInZnO)-based oxide semiconductor material, but other embodiments of the present disclosure are not limited thereto, and the first active layer 130 may be made of another oxide semiconductor material.

The first active layer 130 includes a first channel portion 130*n*, a first source connection portion 131 and a first drain connection portion 132. The first source connection portion 131 is connected to one side of the first channel portion 130*n*, and the first drain connection portion 132 is connected to the other side of the first channel portion 130*n*.

The first channel portion 130*n* overlaps the first gate electrode 150. According to one embodiment of the present disclosure, the first conductive material layers 125 and 126 may not be disposed on the first channel portion 130*n*.

The first source connection portion 131 and the first drain connection portion 132 of the first active layer 130 do not overlap the first gate electrode 150. The first source connection portion 131 and the first drain connection portion 132 may be, in some embodiments, formed by selective conductorization (making conductive) of the semiconductor material.

Referring to FIG. 1, the first conductive material layers 125 and 126 are disposed on the first source connection portion 131 and the first drain connection portion 132. The first source connection portion 131 and the first drain connection portion 132 are disposed between the base substrate 110 and the first conductive material layers 125 and 126, respectively. In more detail, a portion 125 of the first conductive material layers 125 and 126 is disposed on the first source connection portion 131, and another portion 126 of the first conductive material layers 125 and 126 is disposed on the first drain connection portion 132.

The first conductive material layers 125 and 126 may include at least one of titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO). The first conductive material layers 125 and 126 may have reductivity. According to one embodiment of the present disclosure, the transparent conductive oxide (TCO) may include, for example, ITO(InSnO), IZO(InZnO), IO(InO), TO(SnO) and ZO(ZnO). The first conductive material layers 125 and 126 take oxygen from a part of the first active layer 130, which is in contact with the first conductive material layers 125 and 126. As a result, the first conductive material layers 125 and 126 are oxidized, and a part of the active layer 130 contacting the first conductive material layers 125 and 126 is reduced. Since the part of active layer 130 contacting the first conductive material layers 125 and 126 is reduced, the first conductive material layers 125 and 126 are referred to having reducing properties (reductivity). In addition, as the oxygens are taken into the first conductive material layers 125 and 126 from the portions of the first active layer 130 in contact with the first conductive material layers 125 and 126, oxygen vacancy occurs in the portions of first active layer 130 in contact with the first conductive material layers 125 and 126, and thus the portions of first active layer 130 in contact with the first conductive material layers 125 and 126 became conductorized.

For example, when a portion of the first active layer 130, which is in contact with and overlaps the conductive material layer 125, is reduced, oxygen vacancy may be generated in the first active layer 130, and therefore, the first active layer 130 may be selectively conductorized. The first connection portion 131 and the second connection portion 132 may be formed by selective reduction and conductorization of the first active layer 130. According to further still another embodiment of the present disclosure, a part of the active layer 130 contacting the conductive material layer 125 is reduced, which is referred to as a selective reduction. In addition, oxygen vacancy occurs in the portions of first active layer 130 in contact with the conductive material layer 125, and thus the portion of first active layer 130 in contact with the conductive material layer 125 is conductorized, which is referred to as a selective conductorization.

The first active layer 130 may be selectively conductorized by the first conductive material layers 125 and 126. According to one embodiment of the present disclosure, the first source connection portion 131 and the first drain connection portion 132 are in contact with the first conductive material layers 125 and 126, respectively. Areas of the first active layer 130, which are in contact with the first conductive material layers 125 and 126, may be conductorized forming the first source connection portion 131 and the first drain connection portion 132.

In detail, according to one embodiment of the present disclosure, portions of the first active layer 130, which are in contact with the first conductive material layers 125 and 126, may be reduced, respectively, so that the first source connection portion 131 and the first drain connection portion 132 may be made. The portions of the first active layer 130 in contact with the first conductive material layers 125 and 126 may be reduced because oxygens are taken into the first conductive material layers 125 and 126 from the portions of the first active layer 130 in contact with the first conductive material layers 125 and 126. As a result, the first conductive material layers 125 and 126 may be oxidized, and portions of the first active layer 130 in contact with the first conductive material layers 125 and 126 may be reduced.

For example, when a portion of the first active layer 130, which is in contact with and overlaps the first conductive material layers 125 and 126, is reduced, an oxygen vacancy may be generated in the first active layer 130, whereby the first active layer 130 may be selectively conductorized. The first source connection portion 131 and the first drain connection portion 132 may be made by the selective conductorization of the first active layer 130.

According to one embodiment of the present disclosure, the first active layer 130 may be selectively conductorized by the first conductive material layers 125 and 126 without a separate conductorization process such as plasma treatment, ion doping or ultraviolet treatment.

According to one embodiment of the present disclosure, after the oxide semiconductor material and conductive material are stacked, and then patterned by using a half-tone mask, the first active layer 130 and the first conductive material layers 125 and 126 may be formed. Since the first conductive material layers 125 and 126 may be made by a method such as photolithography, the first conductive material layers 125 and 126 that are finely patterned may be formed. Therefore, a length of the first channel portion **130*n*** may be more accurately, precisely, elaborately and finely controlled in greater detail.

Since the length of the first channel portion **130*n* may be more precisely controlled, a process error (margin) for the length of the first channel portion 130*n* may be reduced during a fabricating process of the first thin film transistor TR1. As a result, since the first channel portion 130*n* of a short length may be formed, a size of the first thin film transistor TR1** may be (minimized), and the degree (and/or quality) of integration may be improved.

Also, since the length of the first channel portion **130*n* may be more precisely controlled, an edge of the first channel portion 130*n* can be prevented from being unnecessarily conductorized. Therefore, variation of the threshold voltage due to the conductorization of the edge of the first channel portion 130*n* may be avoided or reduced. As a result, reliability of the first thin film transistor TR1** is improved.

A first gate insulating layer 141 is disposed on the first active layer 130 and the first conductive material layers 125 and 126. The first gate insulating layer 141 may include at least one of a silicon oxide, a silicon nitride or a metal-based oxide. The first gate insulating layer 141 may have a single layered structure, or may have a multi-layered structure. The first gate insulating layer 141 protects the first channel portion **130*n***.

Referring to FIG. 1, the first gate insulating layer 141 may be integrally formed on the base substrate 110. For example, the first gate insulating layer 141 may cover all of the first channel portion **130*n*, the first source connection portion 131 and the first drain connection portion 132**.

The first gate electrode 150 is disposed on the first gate insulating layer 141. The first gate electrode 150 is spaced apart from the first active layer 130 and at least partially overlaps the first active layer 130. At least a portion of the first gate electrode 150 overlaps the channel portion **130*n* of the active layer 130**.

According to one embodiment of the present disclosure, as shown in FIG. 1, the first conductive material layers 125 and 126 may not overlap the first gate electrode 150, but other embodiments of the present disclosure are not limited thereto, and a portion of the first conductive material layers 125 and 126 may overlap the first gate electrode 150. In addition, the first active layer 130 may have a portion that does not overlap the first gate electrode 150 and also does not overlap the first conductive material layers 125 and 126. The portion of the first active layer 130, which does not overlap the first gate electrode 150 and also does not overlap the first conductive material layers 125 and 126, may be referred to as a boundary portion.

According to one embodiment of the present disclosure, the first gate electrode 150 may include a first layer 151 and a second layer 152 on the first layer 151.

Referring to FIG. 1, the second active layer 230 is disposed on the first gate insulating layer 141, and second conductive material layers 225 and 226 are disposed on the second active layer 230.

According to one embodiment of the present disclosure, the first active layer 130 and the second active layer 230 are disposed on their respective layers different from each other, and the second active layer 230 is disposed above the first active layer 130 based on the base substrate 110. In detail, the first active layer 130 is disposed between the base substrate 110 and the second active layer 230.

According to one embodiment of the present disclosure, the second active layer 230 is disposed on the same layer as the first gate electrode 150.

The second active layer 230 may be formed by a semiconductor material. The second active layer 230 may include, for example, an oxide semiconductor material.

The oxide semiconductor material may include at least one of, for example, an IZO(InZnO)-based, IGO(InGaO)-based, ITO(InSnO)-based, IGZO(InGaZnO)-based, IGZTO (InGaZnSnO)-based, GZTO(GaZnSnO)-based, GZO (GaZnO)-based, ITZO(InSnZnO)-based or FIZO (FeInZnO)-based oxide semiconductor material, but other embodiments of the present disclosure are not limited thereto. The second active layer 130 may be made of another oxide semiconductor material known.

The second active layer 230 includes a second channel portion **230*n*, a second source connection portion 231 and a second drain connection portion 232. The second source connection portion 231 is connected to one side of the second channel portion 230*n*, and the second drain connection portion 232 is connected to the other side of the second channel portion 230*n***.

The second channel portion **230*n* overlaps the second gate electrode 250. The second conductive material layers 225 and 226 are not disposed on the second channel portion 230*n***.

The second source connection portion 231 and the second drain connection portion 232 of the second active layer 230 do not overlap the second gate electrode 250. The second source connection portion 231 and the second drain connection portion 232 may be formed by selective conductorization of the semiconductor material.

Referring to FIG. 1, the second conductive material layers 225 and 226 are disposed on the second source connection portion 231 and the second drain connection portion 232. The second source connection portion 231 and the second drain connection portion 232 are disposed between the first active layer 130 and the second conductive material layers 225 and 226, respectively. In detail, a portion 225 of the second conductive material layers 225 and 226 is disposed on the second source connection portion 231, and a portion 226 of the second conductive material layers 225 and 226 is disposed on the second drain connection portion 232.

The second conductive material layers 225 and 226 may include at least one selected from titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO). The second conductive material layers 225 and 226 may have reductivity. The transparent conductive oxide (TCO) may include, for example, ITO(InSnO), IZO(InZnO), IO(InO), TO(SnO) and ZO(ZnO).

The second active layer 130 may be selectively conductorized by the second conductive material layers 225 and 226. According to one embodiment of the present disclosure, the second source connection portion 231 and the second drain connection portion 232 are in contact with the second conductive material layers 225 and 226, respectively. An area of the second active layer 230, which is in contact with the second conductive material layers 225 and 226, may be conductorized, forming the second source connection portion 231 and a second drain connection portion 232.

In detail, portions of the second active layer 230, which are in contact with the second conductive material layers 225 and 226, may be reduced, respectively, so that the second source connection portion 231 and the second drain connection portion 232 may be made. For example, a portion of the second active layer 230, which is in contact with and overlaps the second conductive material layers 225 and 226, is reduced, so that an oxygen vacancy may be generated in the second active layer 230, whereby the second active layer 230 may be selectively conductorized.

According to one embodiment of the present disclosure, after the oxide semiconductor material and conductive material are stacked, the second active layer 230 and the second conductive material layers 225 and 226 may be formed by patterning using a half-tone mask for example, or other patterning techniques. Since the second conductive material layers 225 and 226 may be made by a method such as photolithography, detailed and elaborate second conductive material layers 225 and 226 can be formed with greater accuracy and detail. Therefore, a length of the second channel portion 230*n* may be more finely controlled and dictated.

Since the length of the second channel portion 230*n* may be more finely controlled, a process error (margin) for the length of the second channel portion 230*n* can be minimized during a fabricating process of the second thin film transistor TR2. As a result, since the second channel portion 230*n* of a short length may be formed, a size of the second thin film transistor TR2 may be miniaturized, and the degree of integration may be improved.

Also, since the length of the second channel portion 230*n* may be finely controlled, an edge of the second channel portion 230*n* may be prevented from being unnecessarily conductorized. Therefore, undesired, or relatively large variation of the threshold voltage due to the conductorization of the edge of the second channel portion 230*n* may be avoided. As a result, reliability of the second thin film transistor TR2 may be improved.

According to one embodiment of the present disclosure, the first layer 151 of the first gate electrode 150 is disposed on the same layer as the second active layer 230, and may include the same semiconductor material as that of the second active layer 230. A portion of the second active layer 230 may be the first layer 151 of the first gate electrode 150. In more detail, a portion of any one of the second source connection portion 231 and the second drain connection portion 232 may constitute the first layer 151 of the first gate electrode 150.

The second layer 152 of the first gate electrode 150 is disposed on the same layer as the second conductive material layers 225 and 226, and may include the same conductive material as that of the second conductive material layers 225 and 226. A portion of the second conductive material layers 225 and 226 may constitute the second layer 152 of the first gate electrode 150.

In one embodiment, a portion of the second conductive material layer disposed on any one of the second source connection portion and the second drain connection portion constitutes the second layer of the first gate electrode.

According to one embodiment of the present disclosure, since the first gate electrode 150 may be formed by the second active layer 230 and the second conductive material layers 225 and 226, a separate process for forming the first gate electrode 150 is not required, and a separate contact hole for connecting the first gate electrode 150 is not required. In this way, the second active layer 230 of the second thin film transistor TR2 may be designed to be used as a portion of the gate electrode 150 of the first thin film transistor TR1, so that space efficiency may be improved, that is, the approach results in more efficient utilization of space. As a result, when a capacitor is additionally formed in the thin film transistor substrate 100 according to one embodiment of the present disclosure, a capacitor area may be easily ensured (see FIGS. 5 to 8), that is, the approach means there is sufficient and suitable space for the capacitor.

A second gate insulating layer 142 is disposed on the first gate electrode 150, the second active layer 230 and the second conductive material layers 225 and 226. The second gate insulating layer 142 may include at least one of a silicon oxide, a silicon nitride or a metal-based oxide. The second gate insulating layer 142 may have a single layered structure, or may have a multi-layered structure. The second gate insulating layer 142 may be made of the same material as that of the first gate insulating layer 141, or may be made of a material different from that of the first gate insulating layer 141.

Referring to FIG. 1, the second gate insulating layer 142 may be integrally formed on the base substrate 110. For example, the second gate insulating layer 142 may cover all of the second channel portion 230*n*, the second source connection portion 231 and the second drain connection portion 232.

The second gate electrode 250 is disposed on the second gate insulating layer 142. The second gate electrode 250 is spaced apart from the second active layer 230 and at least partially overlaps the second active layer 230. The second active layer 230 is disposed between the first active layer 130 and the second gate electrode 250.

As shown in FIG. 1, at least a portion of the second gate electrode 250 overlaps the channel portion 230*n* of the active layer 230. According to one embodiment of the present disclosure, the second conductive material layers 225 and 226 may not overlap the second gate electrode 250, but other embodiments of the present disclosure are not limited thereto, and a portion of the second conductive material layers 225 and 226 may overlap the second gate electrode 250. In addition, the second active layer 230 may have a portion that does not overlap the second gate electrode 250 and also does not overlap the second conductive material layers 225 and 226. The portion of the second active layer 230, which does not overlap the second gate electrode 250 and also does not overlap the second conductive material layers 225 and 226, may be referred to as a boundary portion.

Also, referring to FIG. 1, the first source electrode 161, the first drain electrode 162, the second source electrode 261 and the second drain electrode 262 are disposed on the second gate insulating layer 142. The first source electrode 161, the first drain electrode 162, the second source electrode 261 and the second drain electrode 262 may be made of the same material as that of the second gate electrode 250 by the same process as that of the second gate electrode 250.

The first source electrode 161, the first drain electrode 162, the second source electrode 261, the second drain electrode 262 and the second gate electrode 250 may include at least one of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), neodymium (Nd), or titanium (Ti). Each of the first source electrode 161, the first drain electrode 162, the second source electrode 261, the second drain electrode 262 and the second gate electrode 250 may have a multi-layered structure that includes at least two conductive layers having their respective physical properties different from each other.

Referring to FIG. 1, the first source electrode 161 and the first drain electrode 162 are each connected to the first active layer 130 through contact holes. The second source electrode 261 and the second drain electrode 262 are each connected to the second active layer 230 through the contact holes.

Figure 4:
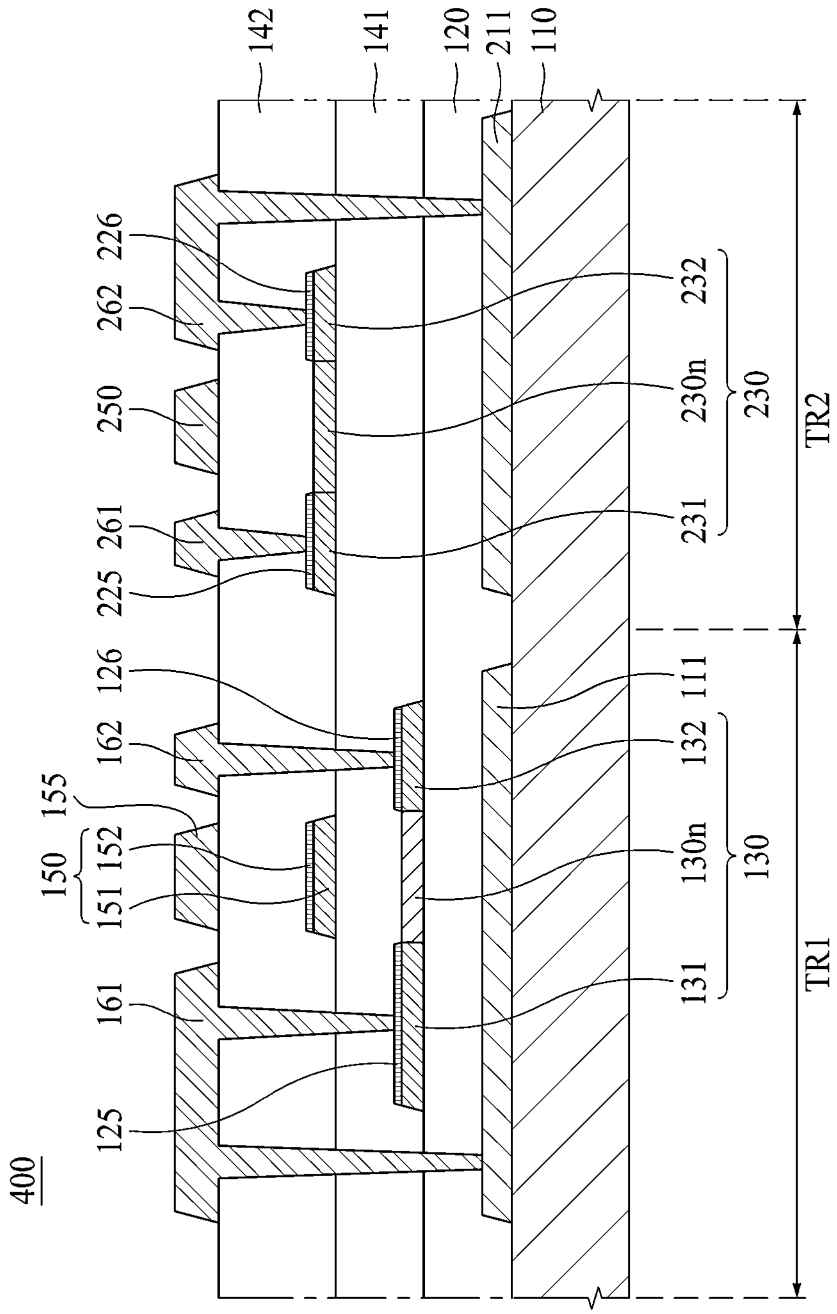
FIG. 4 is a cross-sectional view illustrating a thin film transistor substrate according to further still another embodiment of the present disclosure.

Although not shown in FIG. 1, the first light shielding layer 111 may be connected to any one of the first source electrode 161 and the first drain electrode 162 through the contact hole (with reference to FIG. 4.).

Figure 2:
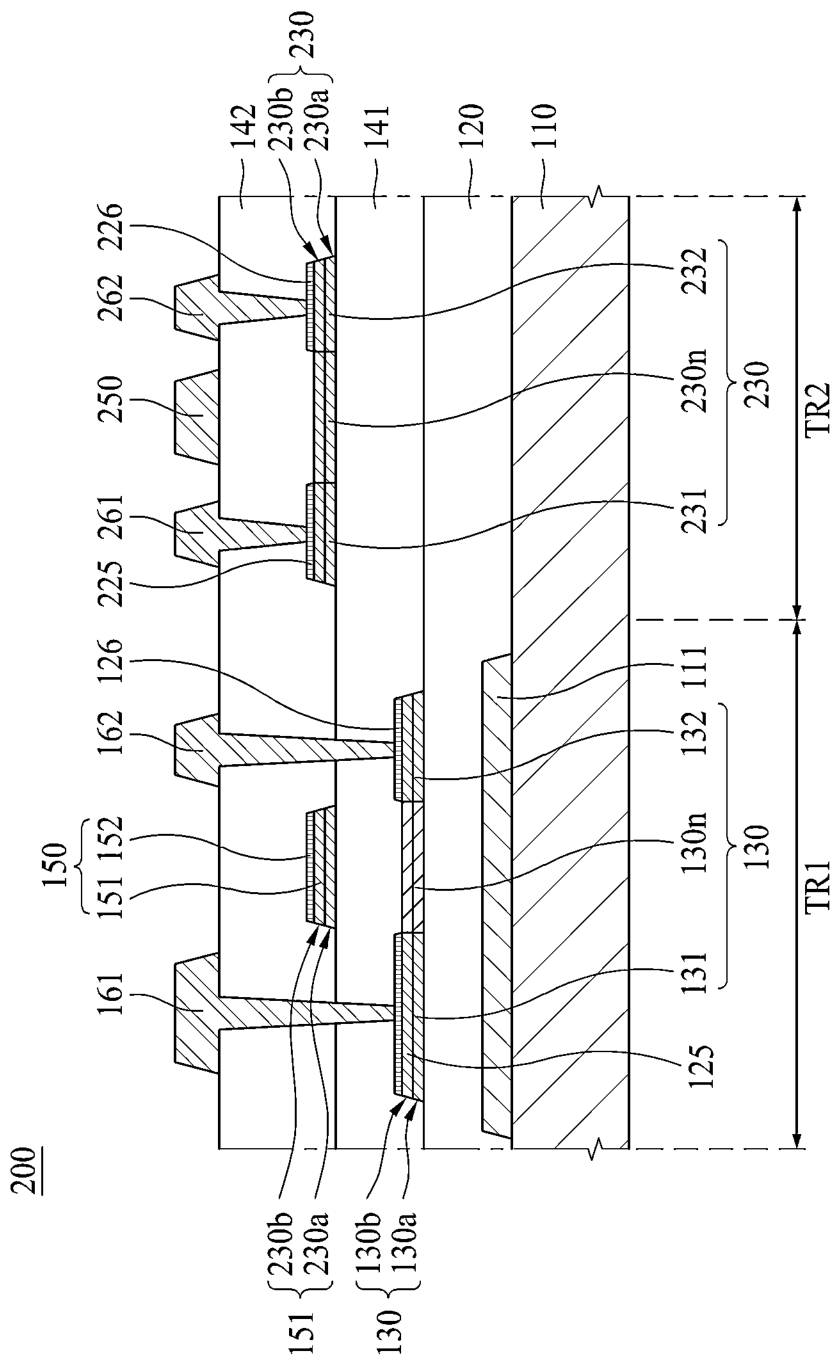
FIG. 2 is a cross-sectional view illustrating a thin film transistor substrate according to another embodiment of the present disclosure.

FIG. 2 is a cross-sectional view illustrating a thin film transistor substrate 200 according to another embodiment of the present disclosure. Hereinafter, the description of the already described or similar elements will be omitted for efficiency.

According to another embodiment of the present disclosure, at least one of the first active layer 130 or the second active layer 230 may have a multi-layered structure. For example, at least one of the first active layer 130 or the second active layer 230 may include first oxide semiconductor layers **130*a* and 230*a* and second oxide semiconductor layers 130*b* and 230*b* on the first oxide semiconductor layers 130*a* and 230*a***.

In detail, referring to FIG. 2, the first active layer 130 may include a first oxide semiconductor layer **130*a* and a second oxide semiconductor layer 130*b* on the first oxide semiconductor layer 130*a*. The second active layer 230 may include a first oxide semiconductor layer 230*a* and a second oxide semiconductor layer 230*b* on the first oxide semiconductor layer 230*a***.

The first oxide semiconductor layers **130*a* and 230*a* and the second oxide semiconductor layers 130*b* and 230*b*** may include the same semiconductor material, or may include semiconductor materials different from each other.

The first oxide semiconductor layers **130*a* and 230*a* support the second oxide semiconductor layers 130*b* and 230*b*. Therefore, the first oxide semiconductor layers 130*a* and 230*a* are referred to as "support layers". The channel portions 130*n* and 230*n* may be formed in the second oxide semiconductor layers 130*b* and 230*b*. Therefore, the second oxide semiconductor layers 130*b* and 230*b* are referred to as "channel layers". However, other embodiments of the present disclosure are not limited to the above example, and the channel portions 130*n* and 230*n* may be formed in the first oxide semiconductor layers 130*a* and 230*a***.

A structure in which the active layers 130 and 230 includes the first oxide semiconductor layers **130*a* and 230*a* and the second oxide semiconductor layers 130*b* and 230*b*** is referred to as a bi-layer structure.

Referring to FIG. 2, the first layer 151 of the first gate electrode 150 may also include a first oxide semiconductor layer **230*a*, and a second oxide semiconductor layer 230*b* on the first oxide semiconductor layer 230*a*. This at least offers the advantages discussed in relation to FIG. 1**.

Figure 3:
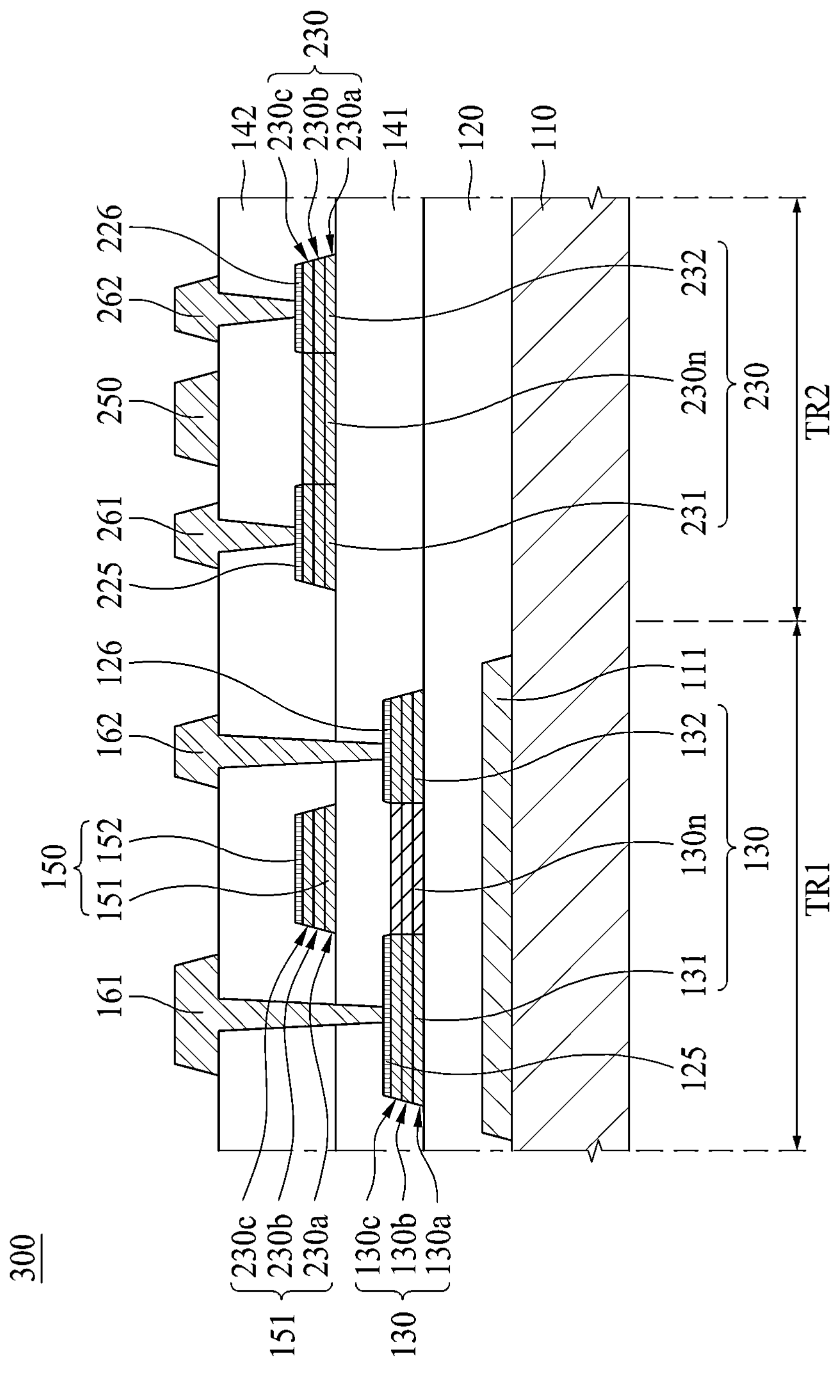
FIG. 3 is a cross-sectional view illustrating a thin film transistor substrate according to still another embodiment of the present disclosure.

FIG. 3 is a cross-sectional view illustrating a thin film transistor substrate 300 according to still another embodiment of the present disclosure. According to still another embodiment of the present disclosure, at least one of the first active layer 130 or the second active layer 230 may further include a third oxide semiconductor layer **130*c* or 230*c* on the second oxide semiconductor layer 130*b* and 230*b***.

In the thin film transistor substrate 300 of FIG. 3 in comparison with the thin film transistor substrate 200 of FIG. 2, the active layers 130 and 230 further include a third oxide semiconductor layer **130*c* or 230*c* on the second oxide semiconductor layers 130*b* and 230*b***.

Referring to FIG. 3, the active layers 130 and 230 include a first oxide semiconductor layer **130*a* and 230*a*, a second oxide semiconductor layer 130*b* and 230*b* and third oxide semiconductor layers 130*c* and 230*c*, but still embodiments of the present disclosure are not limited thereto, and the active layers 130 and 230** may further include other semiconductor layers.

With 3 oxide semiconductor layers, the middle layer is protected from damage during manufacture in both directions, for example the bottom oxide semiconductor layer protects the middle semiconductor layer from gases during manufacture, and the top oxide semiconductor layer protects the middle semiconductor layer from etchant or gases during manufacture.

Referring to FIG. 3, the first layer 151 of the first gate electrode 150 may also include a first oxide semiconductor layer **230*a*, a second oxide semiconductor layer 230*b* on the first oxide semiconductor layer 230*a*, and a third oxide semiconductor layer 230*c* on the second oxide semiconductor layer 230*b***.

The stacked structure of the active layers 130 and 230 and the stacked structure of the first layer 151 of the first gate electrode 150, which are shown in FIGS. 2 and 3, may be also applied to the thin film transistors 400, 500, 600, 700 and 800 shown in FIGS. 4, 5, 6, 7 and 8, which will be described below.

FIG. 4 is a cross-sectional view illustrating a thin film transistor substrate 400 according to further still another embodiment of the present disclosure.

The thin film transistor substrate 400 of FIG. 4 may further include a second light shielding layer 211 and a shielding layer 155, as compared with the thin film transistor substrate 100 of FIG. 1.

The multi-layer configuration has technical advantages, for example, a bottom layer protects the middle layer from gases during manufacture, and the layer protects the middle semiconductor layer from etchant or gases during manufacture.

Referring to FIG. 4, the first light shielding layer 111 may be disposed to overlap the first channel portion **130*n* of the first active layer 130, and may be connected to the first source electrode 161**.

The second light shielding layer 211 may be disposed to overlap the second channel portion **230*n* of the second active layer 230, and may be connected to the second drain electrode 262. The second light shielding layer 211 may be connected to the second source electrode 261**.

Referring to FIG. 4, the shielding layer 155 may be disposed on the first gate electrode 150. The shielding layer 155 may be disposed on the same layer as the second gate electrode 250, and may overlap the first gate electrode 150. The shielding layer 155 may be made of the same material as that of the second gate electrode 250 and formed by the same process as that of the second gate electrode 250.

The shielding layer 155 may shield light incident from an upper portion to protect the first channel portion 130*n* of the first active layer 130.

The addition in FIG. 4 of first gate electrode offers the advantages of stopping scattering of light that can impose on 130*n*, and well as simplification of manufacturing.

Figure 5:
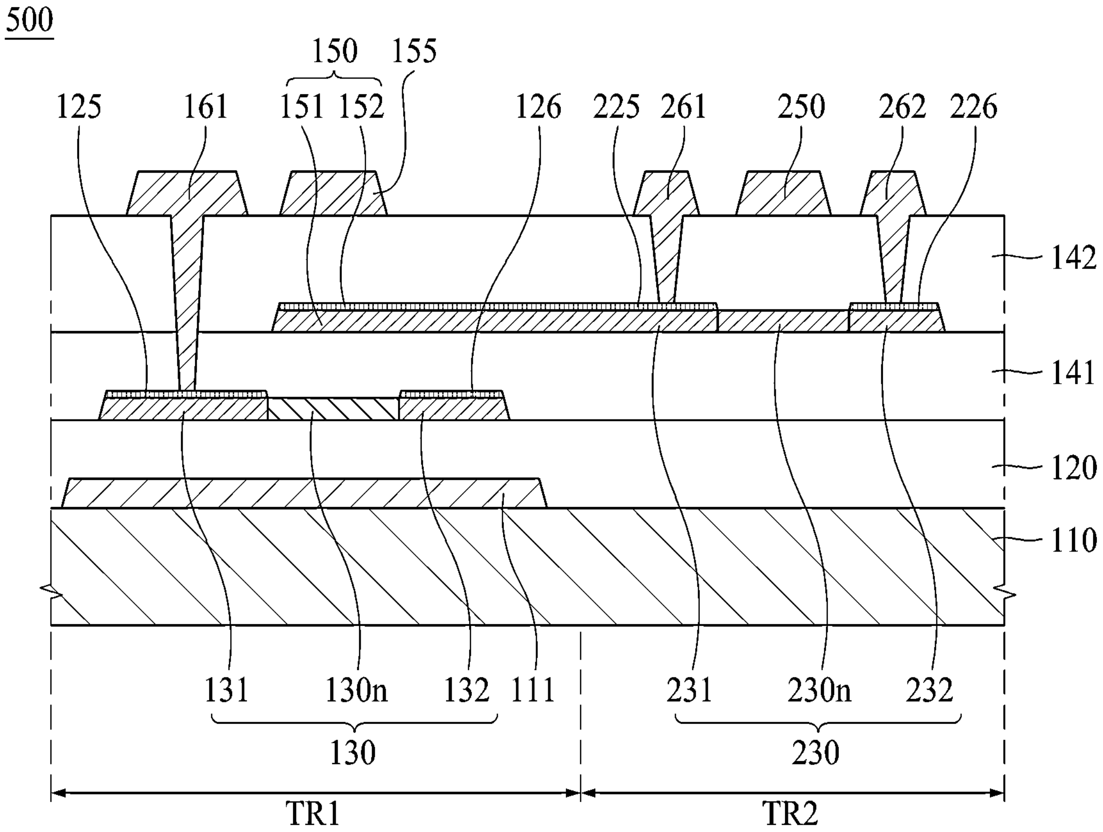
FIG. 5 is a cross-sectional view illustrating a thin film transistor substrate according to further still another embodiment of the present disclosure, with reference to FIG. 4.

FIG. 5 is a cross-sectional view illustrating a thin film transistor substrate 500 according to further still another embodiment of the present disclosure.

According to further still another embodiment of the present disclosure, the first gate electrode 150 may be formed by the second active layer 230 and the second conductive material layer 225 and 226.

Referring to FIG. 5, a portion of the second active layer 230 may constitute the first layer 151 of the first gate electrode 150. In detail, the first layer 151 of the first gate electrode 150 may be integrally formed with the second active layer 230. In more detail, the first layer 151 of the first gate electrode 150 may be integrally formed with one of the second source connection portion 231 and the second drain connection portion 232, or may be formed separately. In FIG. 5, the first layer 151 of the first gate electrode 150 is integrally formed with the second source connection portion 231.

According to further still another embodiment of the present disclosure, a portion of the second conductive material layers 225 and 226 may constitute the second layer 152 of the first gate electrode 150. In detail, the second layer 152 of the first gate electrode 150 may be integrally formed with the second conductive material layers 225 and 226. In more detail, the second conductive material layer 225 on the second source connection portion 231 and the second layer 152 of the first gate electrode 150 may be integrally formed.

The first drain electrode 162 is not shown in FIG. 5. The first drain electrode 162 may be disposed in a portion that is not represented by the cross-sectional view of FIG. 5. According to further still another embodiment of the present disclosure, a stacked body of the first drain connection portion 132 and the first conductive material layer 126 may serve as the first drain electrode 162.

Referring to FIG. 5, the first source electrode 161 is represented as an independent structure that is distinguished from the first active layer 130. However, according to further still another embodiment of the present disclosure, the first source connection portion 131 and the first conductive material layer 125 may together serve as the first source electrode. When a stacked body of the first source connection portion 131 and the first conductive material layer 125 serves as the first source electrode, the structure represented by the reference numeral "161" may be referred to as a connection electrode or a bridge.

According to further still another embodiment of the present disclosure, the first source connection portion 131 of the first active layer 130 may be a source area, and the first drain connection portion 132 may be a drain area. In addition, the stacked body of the first source connection portion 131 and the first conductive material layer 125 may be referred to as the first source electrode, and the stacked body of the first drain connection portion 132 and the first conductive material layer 126 may be referred to as the first drain electrode.

According to further still another embodiment of the present disclosure, the source electrode and the drain electrode may be reversed depending on the operation of the thin film transistor. According to further still another embodiment of the present disclosure, the first source connection portion 131 may be a drain area, and the first drain connection portion 132 may be a source area. In addition, the stacked body of the first source connection portion 131 and the first conductive material layer 125 may serve as the first drain electrode, and the stacked body of the first drain connection portion 132 and the first conductive material layer 126 may serve as the first source electrode.

According to further still another embodiment of the present disclosure, the second source connection portion 231 of the second active layer 230 may be a source area, and the second drain connection portion 232 thereof may be a drain area. According to further still another embodiment of the present disclosure, a stacked body of the second source connection portion 231 and the second conductive material layer 225 may serve as the second source electrode, and a stacked body of the second drain connection portion 232 and the second conductive material layer 226 may serve as the second drain electrode.

When the stacked body of the second source connection portion 231 and the second conductive material layer 225 serves as the second source electrode, the structure represented by the reference numeral "261" may be referred to as a connection electrode or a bridge. When the stacked body of the second drain connection portion 232 and the second conductive material layer 226 serves as the second drain electrode, the structure represented by the reference numeral "262" may be referred to as a connection electrode or a bridge.

According to further still another embodiment of the present disclosure, the second source connection portion 231 may be a drain area, and the second drain connection portion 232 may be a source area. In addition, the stacked body of the second source connection portion 231 and the second conductive material layer 225 may serve as the second drain electrode, and the stacked body of the second drain connection portion 232 and the second conductive material layer 226 may serve as the second source electrode.

Figure 6:
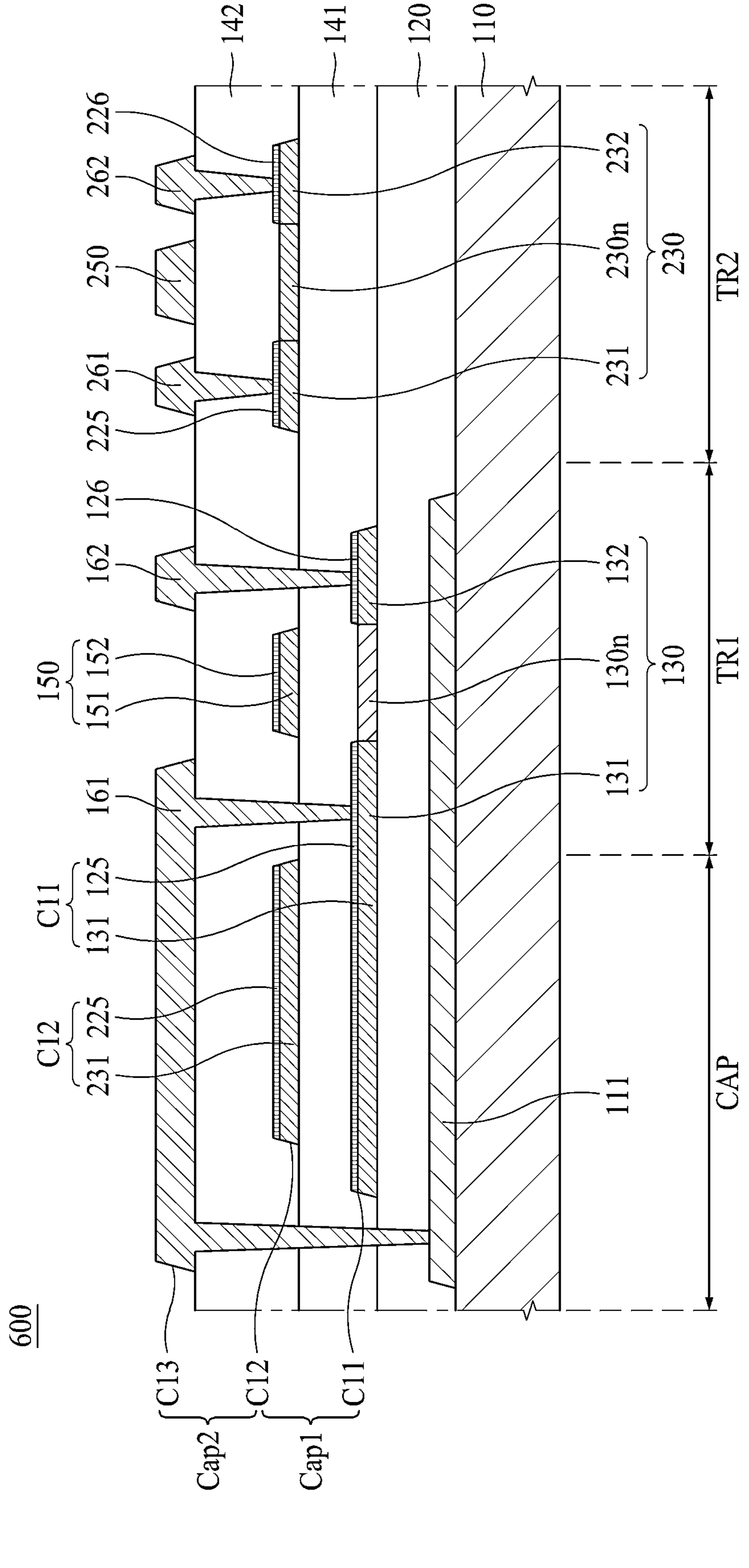
FIG. 6 is a cross-sectional view illustrating a thin film transistor substrate according to further still another embodiment of the present disclosure.

FIG. 6 is a cross-sectional view illustrating a thin film transistor substrate 600 according to further still another embodiment of the present disclosure.

According to further still another embodiment of the present disclosure, the thin film transistor substrate 600 may include a capacitor CAP.

Referring to FIG. 6, the thin film transistor substrate 600 may include a first capacitor electrode C11 and a second capacitor electrode C12. The first capacitor electrode C11 and the second capacitor electrode C12 may overlap each other to form a first capacitor Cap1.

According to further still another embodiment of the present disclosure, the first capacitor electrode C11 may be connected to any one of the first source connection portion 131 and the first drain connection portion 132. In FIG. 6, a configuration in which the first capacitor electrode C11 is connected to the first source connection portion 131 is illustrated.

According to another embodiment of the present disclosure, the second capacitor electrode C12 may be connected to any one of the second source connection portion 231 and the second drain connection portion 232. Although not shown in FIG. 6, the second capacitor electrode C12 may be connected to the second source connection portion 231.

According to further still another embodiment of the present disclosure, the first capacitor electrode C11 may include a first layer, and a second layer on the first layer. The first capacitor electrode C11 may include a first layer integrally formed with any one of the first source connection portion 131 and the first drain connection portion 132, and a second layer integrally formed with the first conductive material layer 125 or 126.

In FIG. 6, the first capacitor electrode C11 includes a first layer integrally formed with the first source connection portion 131 and a second layer integrally formed with the first conductive material layer 125 on the first source connection portion 131.

According to further still another embodiment of the present disclosure, since the first capacitor electrode C11 may be formed by the first active layer 130 and the first conductive material layers 125 and 126, a separate process for forming the first capacitor electrode C11 is not required, and a separate contact hole for connecting the first capacitor electrode C11 with the first active layer 130 is not required. As a result, space efficiency may be improved, that is, there is a space saving so that an area of the first capacitor electrode C11 may be enlarged.

According to further still another embodiment of the present disclosure, the second capacitor electrode C12 may include a first layer, and a second layer on the first layer. The second capacitor electrode C12 may include a first layer integrally formed with any one of the second source connection portion 231 and the second drain connection portion 232, and a second layer integrally formed with the second conductive material layer 225 or 226.

In FIG. 6, the second capacitor electrode C12 includes a first layer integrally formed with the second source connection portion 231, and a second layer integrally formed with the second conductive material layer 225 on the second source connection portion 231.

According to one embodiment of the present disclosure, since the second capacitor electrode C12 may be formed by the second active layer 230 and the second conductive material layers 225 and 226, a separate process for forming the second capacitor electrode C12 is not required, and a separate contact hole for connecting the second capacitor electrode C12 with the second active layer 230 is not required. As a result, space efficiency may be improved, that is, there is a space saving so that an area of the second capacitor electrode C12 may be enlarged.

According to further still another embodiment of the present disclosure, since the area of the first capacitor electrode C11 and the area of the second capacitor electrode C12 may be enlarged, an area of the first capacitor Cap1 formed by an overlap between the first capacitor electrode C11 and the second capacitor electrode C12 may be enlarged.

Referring to FIG. 6, the thin film transistor substrate 600 according to further still another embodiment of the present disclosure may further include a third capacitor electrode C13 disposed on the same layer as the second gate electrode 250. The third capacitor electrode C13 may be made of the same material as that of the second gate electrode 250 and made by the same process as that of the second gate electrode 250.

According to further still another embodiment of the present disclosure, the second capacitor electrode C12 and the third capacitor electrode C13 may overlap each other to form a second capacitor Cap2.

Referring to FIG. 6, the first source electrode 161 and the third capacitor electrode C13 may be connected to each other. The first source electrode 161 and the third capacitor electrode C13 may be integrally formed.

As the first source electrode 161 and the third capacitor electrode C13 are connected to each other, the first capacitor electrode C11 and the third capacitor electrode C13 may be connected to each other, and the same voltage may be applied to the first capacitor electrode C11 and the third capacitor electrode C13.

Referring to FIG. 6, the second capacitor electrode C12 is disposed between the first source electrode 161 and the third capacitor electrode C13. As a result, the same effect as that two capacitors Cap1 and Cap2 are formed with the second capacitor electrode C12 interposed therebetween may be obtained.

Figure 7:
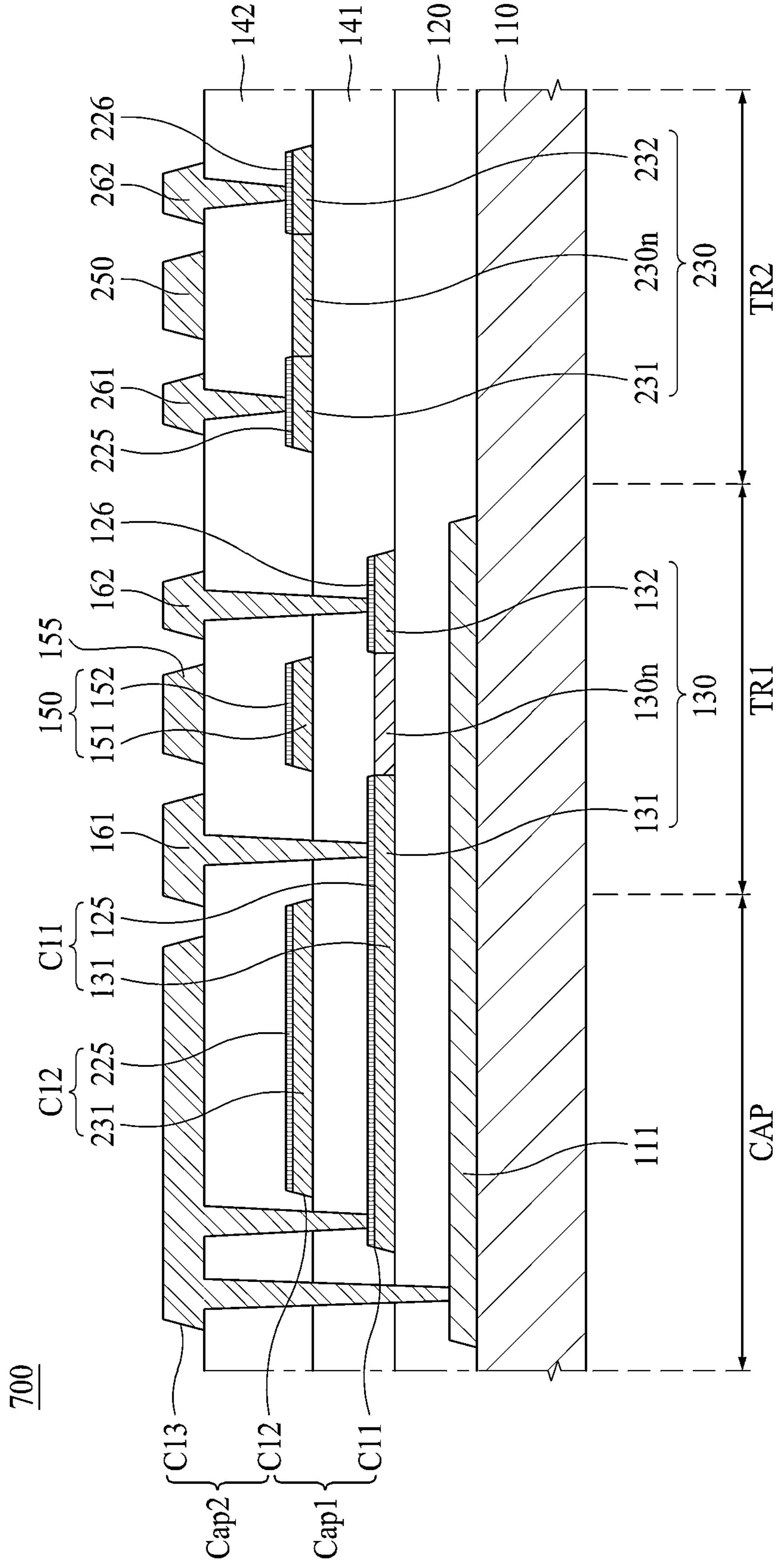
FIG. 7 is a cross-sectional view illustrating a thin film transistor substrate according to further still another embodiment of the present disclosure.

FIG. 7 is a cross-sectional view illustrating a thin film transistor substrate 700 according to further still another embodiment of the present disclosure.

Referring to FIG. 7, the first source electrode 161 may be formed independently of the third capacitor electrode C13. The third capacitor electrode C13 may be connected to the first capacitor electrode C11 through a contact hole.

The first source electrode 161 may be connected to another element of the thin film transistor substrate 700. The presence of first gate electrode 150 again offers advantages in terms of managing light scattering.

Figure 8:
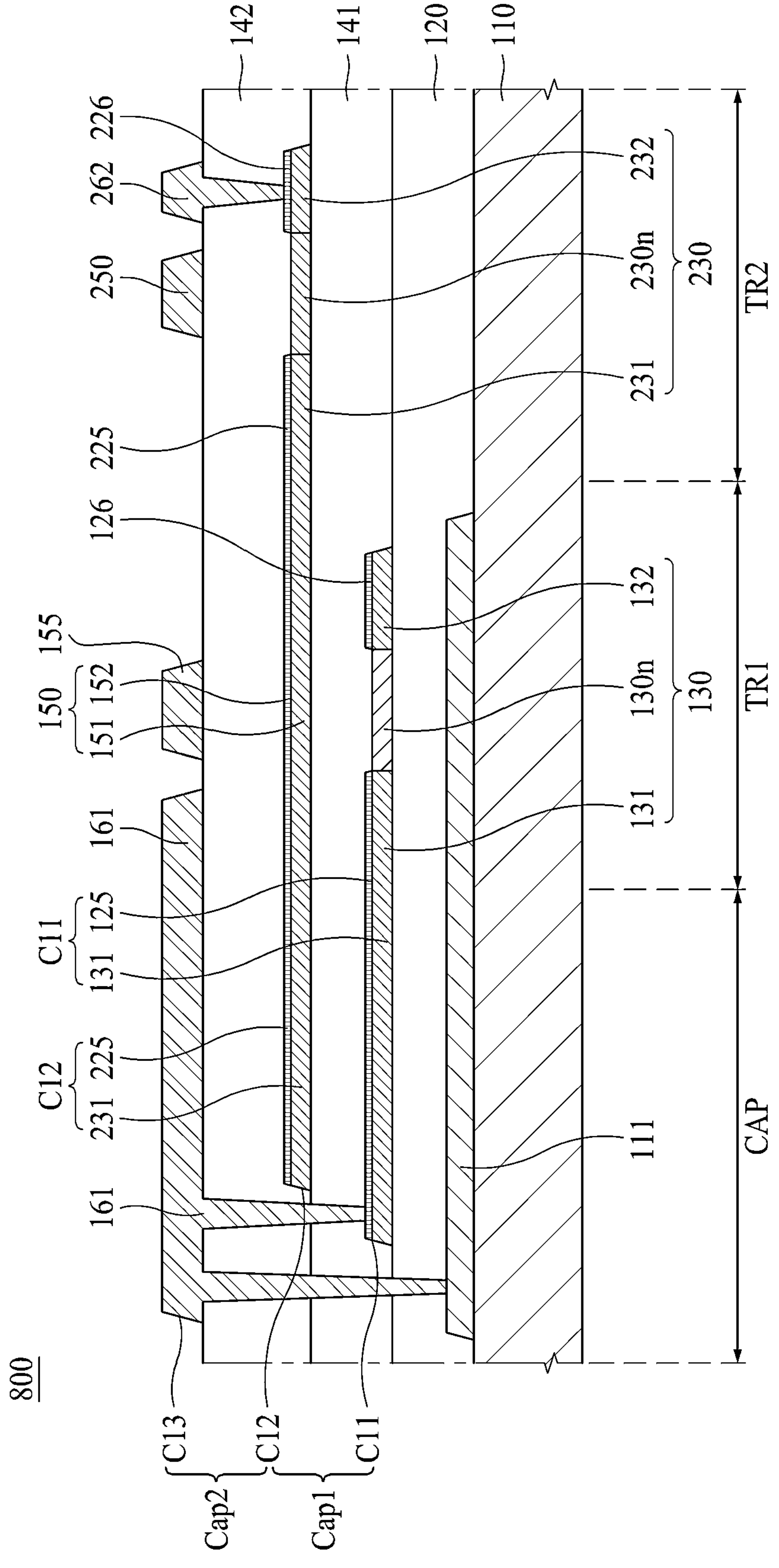
FIG. 8 is a cross-sectional view illustrating a thin film transistor substrate according to further still another embodiment of the present disclosure.

FIG. 8 is a cross-sectional view illustrating a thin film transistor substrate 800 according to further still another embodiment of the present disclosure.

Referring to FIG. 8, the first gate electrode 150 and the second capacitor electrode C12 may be integrally formed. In addition, the first gate electrode 150 and the second capacitor electrode C12 may be integrally formed with the stacked body of the first connection portion 231 and the second conductive material layer 225.

As the second capacitor electrode C12, the first gate electrode 150 and the stacked body of the first connection portion 231 and the second conductive material layer 225 are integrally formed, space efficiency may be improved such that there is a space saving so that the area of the second capacitor electrode C12 may be enlarged.

Hereinafter, the display device to which the above-described thin film transistors 100, 200, 300, 400, 500, 600, 700 and 800 are applied will be described in detail.

Figure 9:
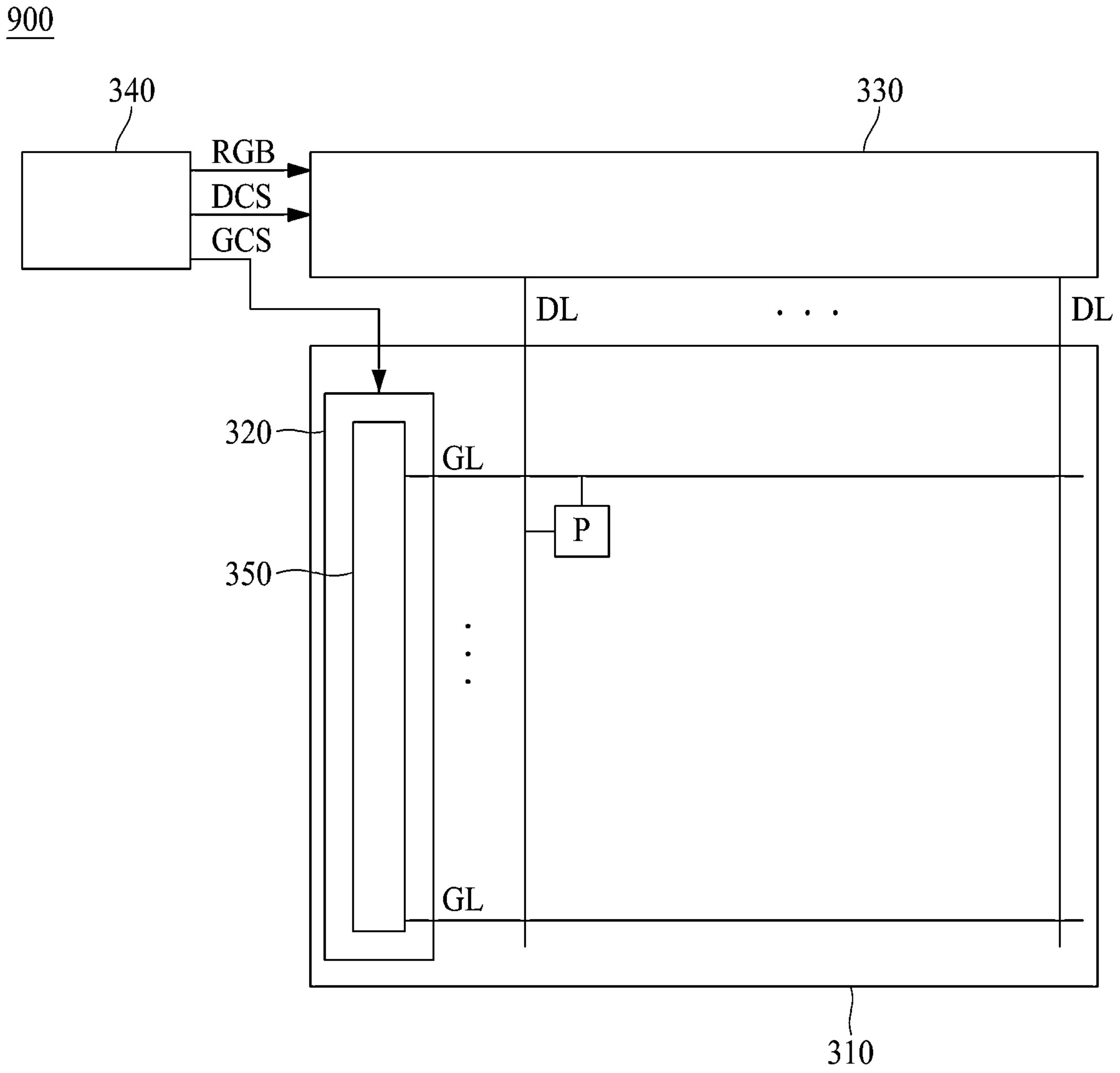
FIG. 9 is a schematic view illustrating a display device according to further still another embodiment of the present disclosure.

FIG. 9 is a schematic view illustrating a display device 900 according to further still another embodiment of the present disclosure.

As shown in FIG. 9, the display device 900 according to further still another embodiment of the present disclosure includes a display panel 310, a gate driver 320, a data driver 330 and a controller 340.

Gate lines GL and data lines DL are disposed in the display panel 310, and pixels P are disposed in intersection areas of the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst and a gate clock GCLK. Also, control signals for controlling a shift register may be included in the gate control signal GCS.

The data control signal DCS includes a source start pulse SSP, a source shift clock signal SSC, a source output enable signal SOE and a polarity control signal POL.

The data driver 330 supplies a data voltage to the data lines DL of the display panel 310. In detail, the data driver 330 converts the image data RGB input from the controller 340 into an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a time period when one image is output through the display panel 310. The gate pulse has a turn-on voltage capable of turning on a switching element (such as a thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

According to one embodiment of the present disclosure, the gate driver 320 may be packaged on the base substrate 110. In this way, a structure in which the gate driver 320 is directly packaged on the base substrate 110 will be referred to as a Gate In Panel (GIP) structure.

Figure 10:
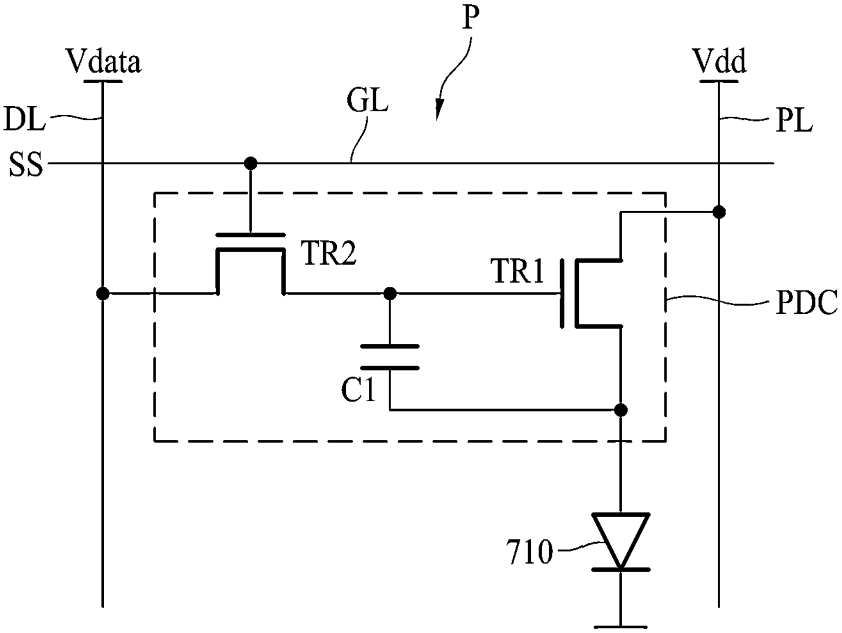
FIG. 10 is a circuit diagram of any one pixel in FIG. 9.
Figure 11:
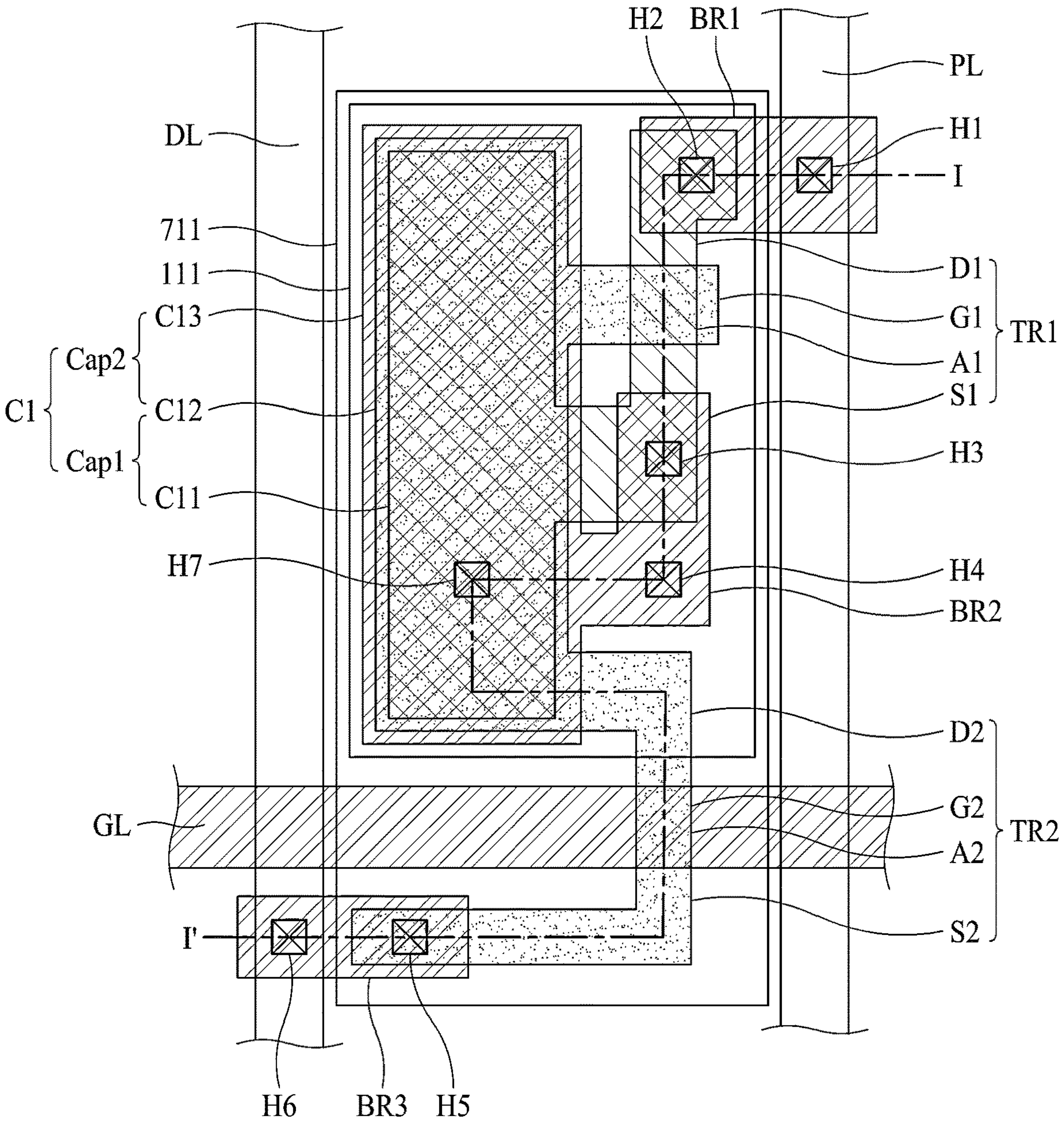
FIG. 11 is a plan view illustrating the pixel of FIG. 10.
Figure 12:
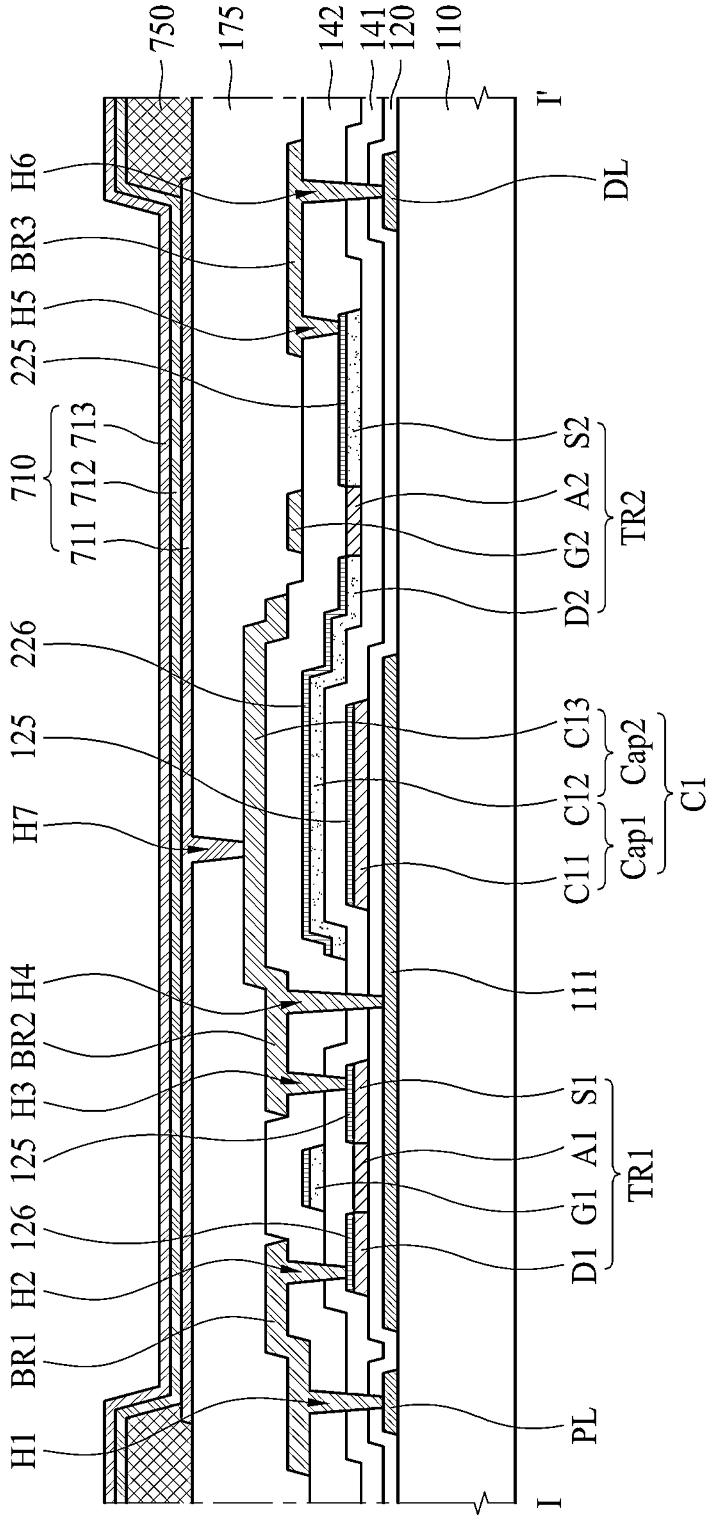
FIG. 12 is a cross-sectional view taken along line I-I' of FIG. 11.

FIG. 10 is a circuit diagram illustrating any one pixel P of FIG. 9, FIG. 11 is a plan view illustrating a pixel P of FIG. 10, and FIG. 12 is a cross-sectional view taken along line I-I' of FIG. 11.

The circuit diagram of FIG. 10 is an equivalent circuit diagram for the pixel P of the display device 900 that includes an organic light emitting diode (OLED) as a display element 710.

The pixel P includes a display element 710 and a pixel driving circuit PDC for driving the display element 710.

The pixel driving circuit PDC of FIG. 10 includes a first thin film transistor TR1 that is a driving transistor, and a second thin film transistor TR2 that is a switching transistor.

The second thin film transistor TR2 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the first thin film transistor TR1 controls the driving voltage Vdd. The driving voltage Vdd is a pixel driving voltage for driving the organic light emitting diode (OLED) that is the display element 710.

When the second thin film transistor TR2 is turned on by the scan signal SS applied from the gate driver 320 through the gate line GL, the data voltage Vdata supplied through the data line DL is supplied to a gate electrode G2 of the first thin film transistor TR1 connected with the display element 710. The data voltage Vdata is charged in a first capacitor C1 formed between the gate electrode G2 and a source electrode S2 of the first thin film transistor TR1.

The amount of a current supplied to the organic light emitting diode (OLED), which is the display element 710, through the first thin film transistor TR1 is controlled in accordance with the data voltage Vdata, whereby a gray scale of light emitted from the display element 710 may be controlled.

Referring to FIGS. 11 and 12, the first thin film transistor TR1 and the second thin film transistor TR2 are disposed on the base substrate 110.

The base substrate 110 may be made of glass or plastic. Plastic having a flexible property, for example, polyimide (PI) may be used as the base substrate 110.

The data line DL, the driving power line PL and the first light shielding layer 111 are disposed on the base substrate 110.

The light shielding layer 111 may have light shielding characteristics. The light shielding layer 111 may shield light incident from the outside to protect active layers A1 and A2.

A buffer layer 120 is disposed on the data line DL, the driving power line PL and the light shielding layer 111. The buffer layer 120 is made of an insulating material, and protects the active layers A1 and A2 from external water and/or oxygen.

The first active layer A1 of the first thin film transistor TR1 is disposed on the buffer layer 120. The first active layer A1 may include, for example, an oxide semiconductor material. The first active layer A1 may be made of an oxide semiconductor layer made of an oxide semiconductor material.

The first active layer A1 of the first thin film transistor TR1 may include a first channel portion, a first source connection portion, and a first drain connection portion. The first channel portion of the first active layer A1 overlaps the first gate electrode G1.

The first conductive material layers 125 and 126 are dispose don the first active layer A1. The first conductive material layers 125 and 126 are not disposed on the first channel portion of the first active layer A1.

Referring to FIGS. 11 and 12, a portion of the first active layer A1 and the first conductive material layers 125 and 126 may form the first capacitor electrode C11 of the storage capacitor C1. For example, the stacked body comprised of the first source connection portion, which serves as the first source electrode S1, and the first conductive material layer 125 may serve as the first capacitor electrode C11.

A first gate insulating layer 141 is disposed on the first active layer A1 and the first conductive material layers 125 and 126. The first gate insulating layer 141 may cover an entire upper surface of the first active layer A1.

The second active layer A2 of the second thin film transistor TR2 is disposed on the first gate insulating layer 141. The second active layer A2 may include, for example, an oxide semiconductor material. The second active layer A2 may be made of an oxide semiconductor layer made of an oxide semiconductor material.

The second active layer A2 of the second thin film transistor TR2 may include a second channel portion, a second source connection portion, and a second drain connection portion. The second channel portion of the second active layer A2 overlaps the second gate electrode G2.

The second conductive material layers 225 and 226 are disposed on the second active layer A2. The second conductive material layers 225 and 226 are not disposed on the second channel portion of the second active layer A2.

Referring to FIGS. 11 and 12, a portion of the second active layer A2 and the second conductive material layers 225 and 226 may form the second capacitor electrode C12 of the storage capacitor C1. For example, the stacked body comprised of the second drain connection portion, which serves as the second drain electrode D2, and the second conductive material layer 225 may serve as the second capacitor electrode C12. The first capacitor Cap1 is formed by the first capacitor electrode C11 and the second capacitor electrode C12.

Also, the first gate electrode G1 is disposed on the first gate insulating layer 141. The first gate electrode G1 may be comprised of a stacked body of the second active layer and the second conductive material layers 225 and 226. The first gate electrode G1 is comprised of a stacked body of the second drain connection portion, which serves as the second drain electrode D2, and the second conductive material layer 226 in the second thin film transistor.

A second gate insulating layer 142 is disposed on the first gate electrode G1, the second active layer A2 and the second conductive material layers 225 and 226. The second gate insulating layer 142 may cover up to and including an entire upper surface of the second active layer A2.

The gate line GL is disposed on the second gate insulating layer 142. A portion of the gate line GL may be the second gate electrode G2 of the second thin film transistor TR2.

Also, a first bridge BR1, a second bridge BR2, a third bridge BR3 and a third capacitor electrode C13 are disposed on the second gate insulating layer 142. The second gate electrode G2, the first bridge BR1, the second bridge BR2, the third bridge BR3 and the third capacitor electrode C13 may be made of the same material and by the same process.

The first bridge BR1 is connected to the driving power line PL through a first contact hole H1, and is in contact with the first drain electrode D1 formed in the first active layer A1 through a second contact hole H2. According to further still another embodiment of the present disclosure, the first bridge BR1 may be referred to as the first drain electrode D1.

The second bridge BR2 may be integrally formed with the third capacitor electrode C13.

The second bridge BR2 is in contact with the first source electrode S1 formed in the first active layer A1 through a third contact hole H3. The second bridge BR2 may be referred to as the first source electrode S1.

The third capacitor electrode C13 is connected to the first thin film transistor TR1 through the second bridge BR2. A second capacitor Cap2 is formed by the third capacitor electrode C13 and the second capacitor electrode C12. A storage capacitor C1 is formed by the first capacitor Cap1 and the second capacitor Cap2.

The second bridge BR2 may be also connected to the first light shielding layer through a fourth contact hole H4.

The third bridge BR3 is in contact with the second source electrode S2 formed in the second active layer A2 through a fifth contact hole H5. The third bridge BR3 may be referred to as the second source electrode S2. Also, the third bridge BR3 is connected to the data line DL through a sixth contact hole H6.

A planarization layer 175 is disposed on the second gate electrode G2, the first bridge BR1, the second bridge BR2, the third bridge BR3 and the third capacitor electrode C13. The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 is in contact with the third capacitor electrode C13 integrally formed with the second bridge BR2 through a seventh contact hole H7 formed in the planarization layer 175. As a result, the first electrode 711 may be connected to the first source electrode S1 of the first thin film transistor TR1.

A bank layer 750 is disposed at an edge of the first electrode 711. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 12 is an organic light emitting diode (OLED). Therefore, the display device 900 according to one embodiment of the present disclosure is an organic light emitting display device.

Figure 13:
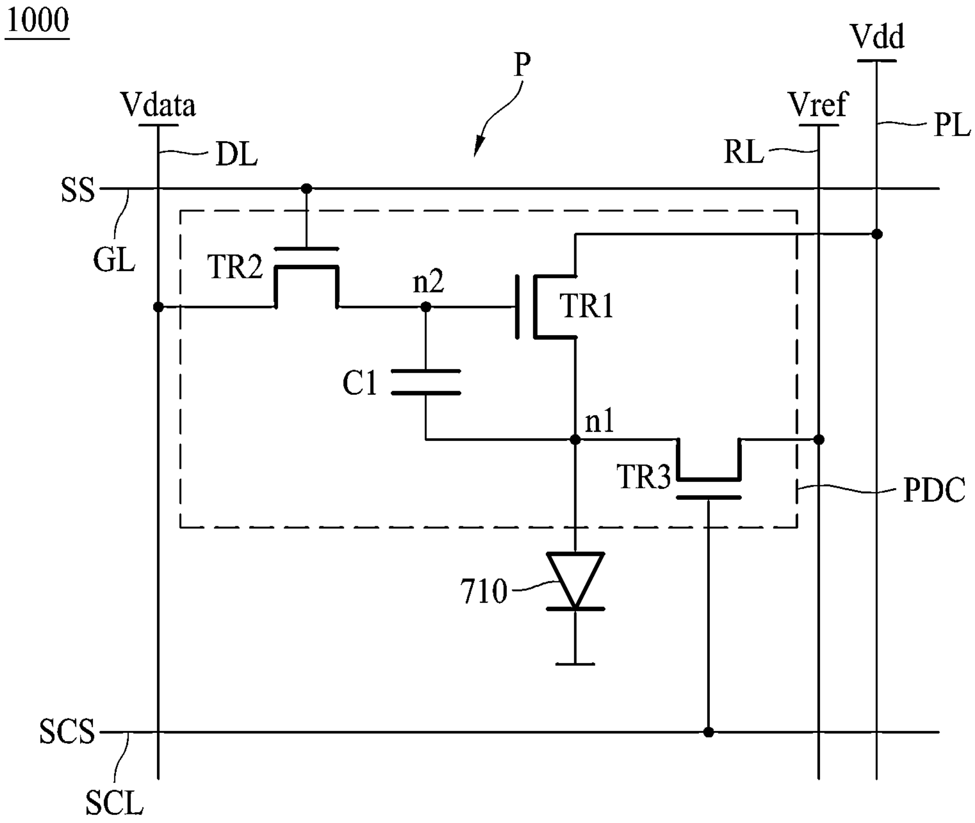
FIG. 13 is a circuit diagram illustrating any one pixel of a display device according to further still another embodiment of the present disclosure.

FIG. 13 is a circuit diagram illustrating any one pixel P of a display device 1000 according to further still another embodiment of the present disclosure.

FIG. 13 is an equivalent circuit diagram illustrating a pixel P of an organic light emitting display device.

The pixel P of the display device 1000 shown in FIG. 13 includes an organic light emitting diode (OLED) that is a display element 710 and a pixel driving circuit PDC for driving the display element 710. The display element 710 is connected with the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

The pixel driving circuit PDC includes, for example, a second thin film transistor TR2 (switching transistor) connected with the gate line GL and the data line DL, a first thin film transistor TR1 (driving transistor) for controlling a magnitude of a current output to the display element 710 in accordance with the data voltage Vdata transmitted through the second thin film transistor TR2, and a third thin film transistor TR3 (reference transistor) for sensing characteristics of the first thin film transistor TR1.

A storage capacitor C1 (Cst) is positioned between the gate electrode of the first thin film transistor TR1 and the display element 710.

The second thin film transistor TR2 is turned on by the scan signal SS supplied to the gate line GL to transmit the data voltage Vdata, which is supplied to the data line DL, to the gate electrode of the first thin film transistor TR1.

The third thin film transistor TR3 is connected to a first node n1 between the first thin film transistor TR1 and the display element 710 and the reference line RL, and thus is turned on or off by the sensing control signal SCS and senses characteristics of the first thin film transistor TR1, which is a driving transistor, for a sensing period.

A second node n2 connected with the gate electrode of the first thin film transistor TR1 is connected with the second thin film transistor TR2. The storage capacitor C1 is formed between the second node n2 and the first node n1.

When the second thin film transistor TR2 is turned on, the data voltage Vdata supplied through the data line DL is supplied to the gate electrode of the first thin film transistor TR1. The data voltage Vdata is charged in the first capacitor C1 formed between the gate electrode and the source electrode of the first thin film transistor TR1.

When the first thin film transistor TR1 is turned on, the current is supplied to the display element 710 through the first thin film transistor TR1 in accordance with the driving voltage Vdd for driving the pixel, whereby light is output from the display element 710.

Figure 14:
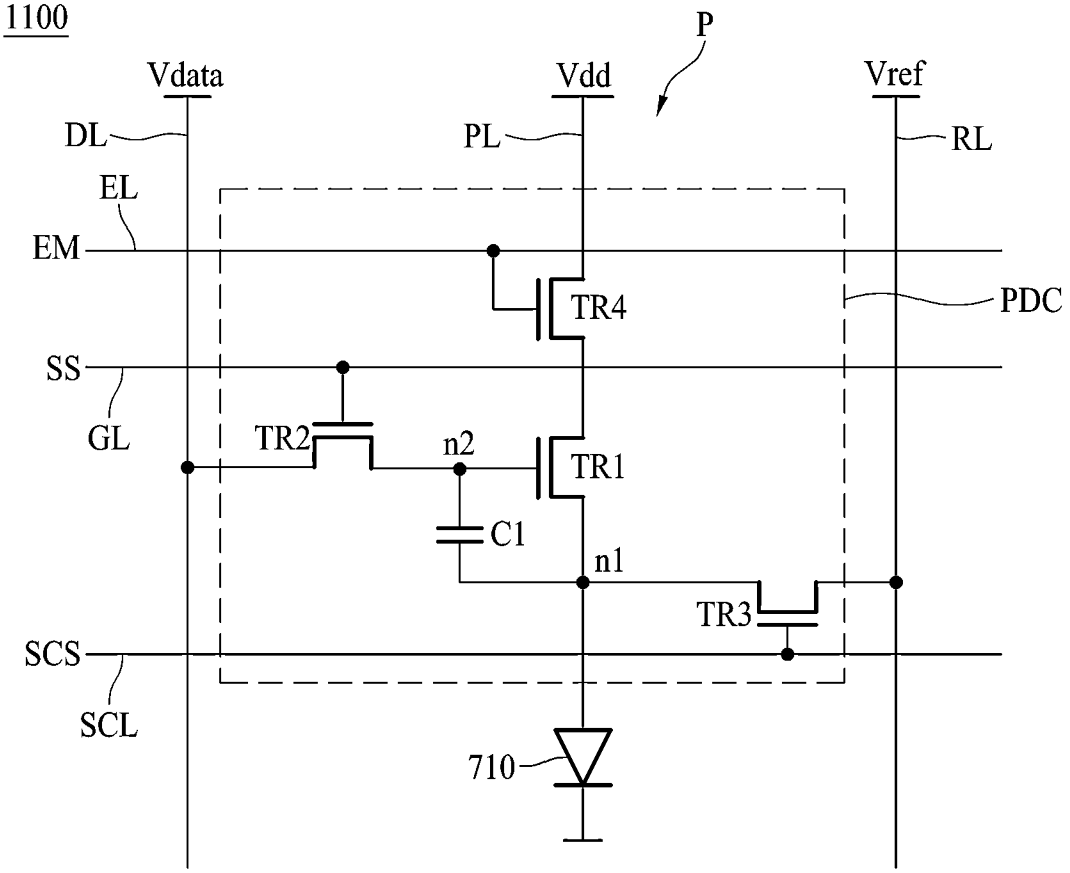
FIG. 14 is a circuit diagram illustrating any one pixel of a display device according to further still another embodiment of the present disclosure.

FIG. 14 is a circuit diagram illustrating a pixel of a display device 1100 according to further still another embodiment of the present disclosure.

The pixel P of the display device 1100 shown in FIG. 14 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 13, the pixel P of FIG. 14 further includes an emission control line EL. An emission control signal EM is supplied to the emission control line EL.

Also, the pixel driving circuit PDC of FIG. 14 further includes a fourth thin film transistor TR4 that is an emission control transistor for controlling a light emission timing of the first thin film transistor TR1, in comparison with the pixel driving circuit PDC of FIG. 13.

A storage capacitor C1 is positioned between the gate electrode of the first thin film transistor TR1 and the display element 710.

The second thin film transistor TR2 is turned on by the scan signal SS supplied to the gate line GL to transmit the data voltage Vdata, which is supplied to the data line DL, to the gate electrode of the first thin film transistor TR1.

The third thin film transistor TR3 is connected to the reference line RL, and thus is turned on or off by the sensing control signal SCS and senses characteristics of the second thin film transistor TR1, which is a driving transistor, during a sensing period.

The fourth thin film transistor TR4 transfers the driving voltage Vdd to the first thin film transistor TR1 in accordance with the emission control signal EM or shields the driving voltage Vdd. When the fourth thin film transistor TR4 is turned on, a current is supplied to the first thin film transistor TR1, whereby light is output from the display element 710.

The pixel driving circuit PDC according to further still another embodiment of the present disclosure may be formed in various structures in addition to the above-described structure. The pixel driving circuit PDC may include, for example, five or more thin film transistors.

Figure 15:
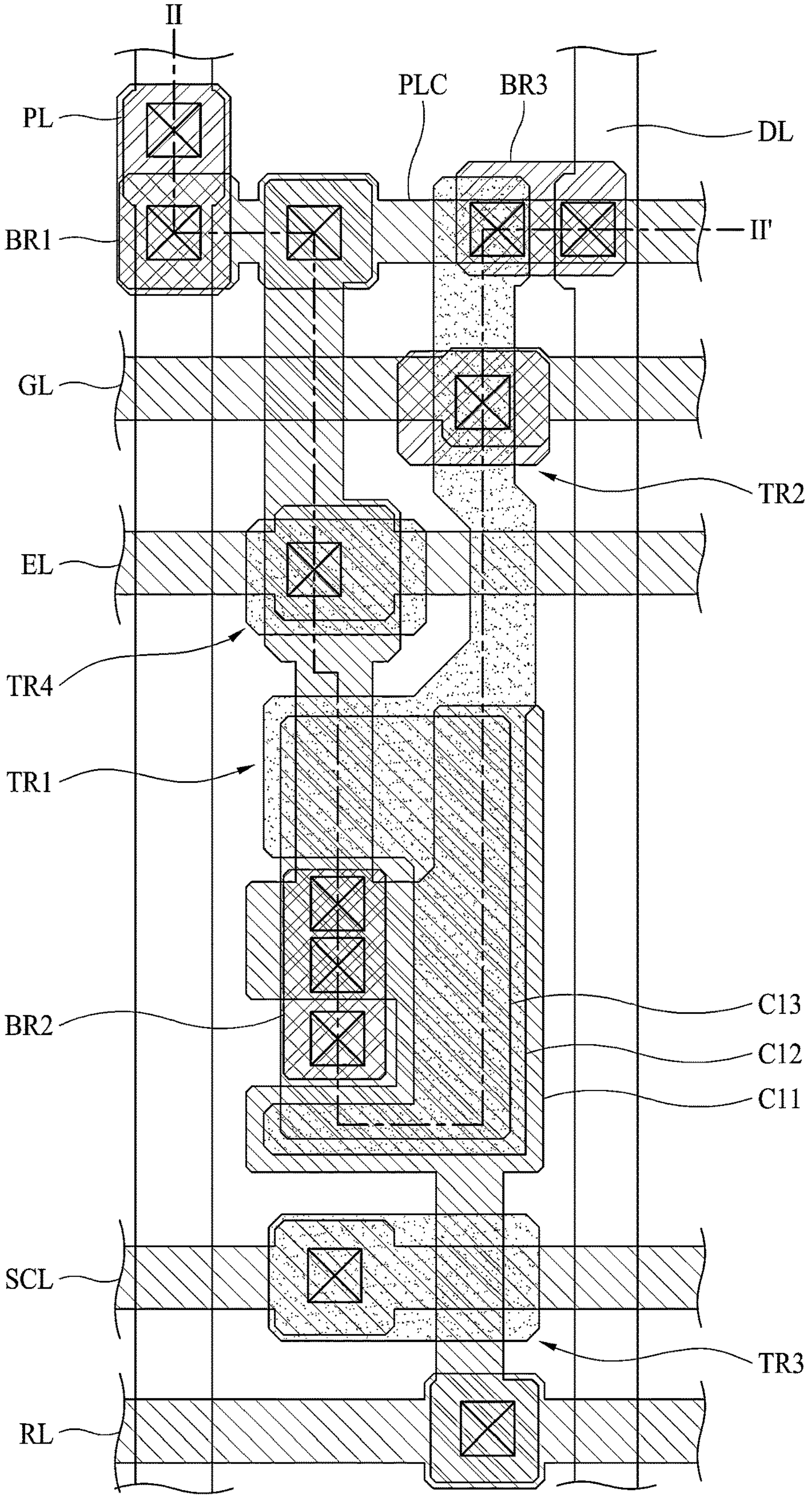
FIG. 15 is a plan view illustrating the pixel of FIG. 14.
Figure 16:
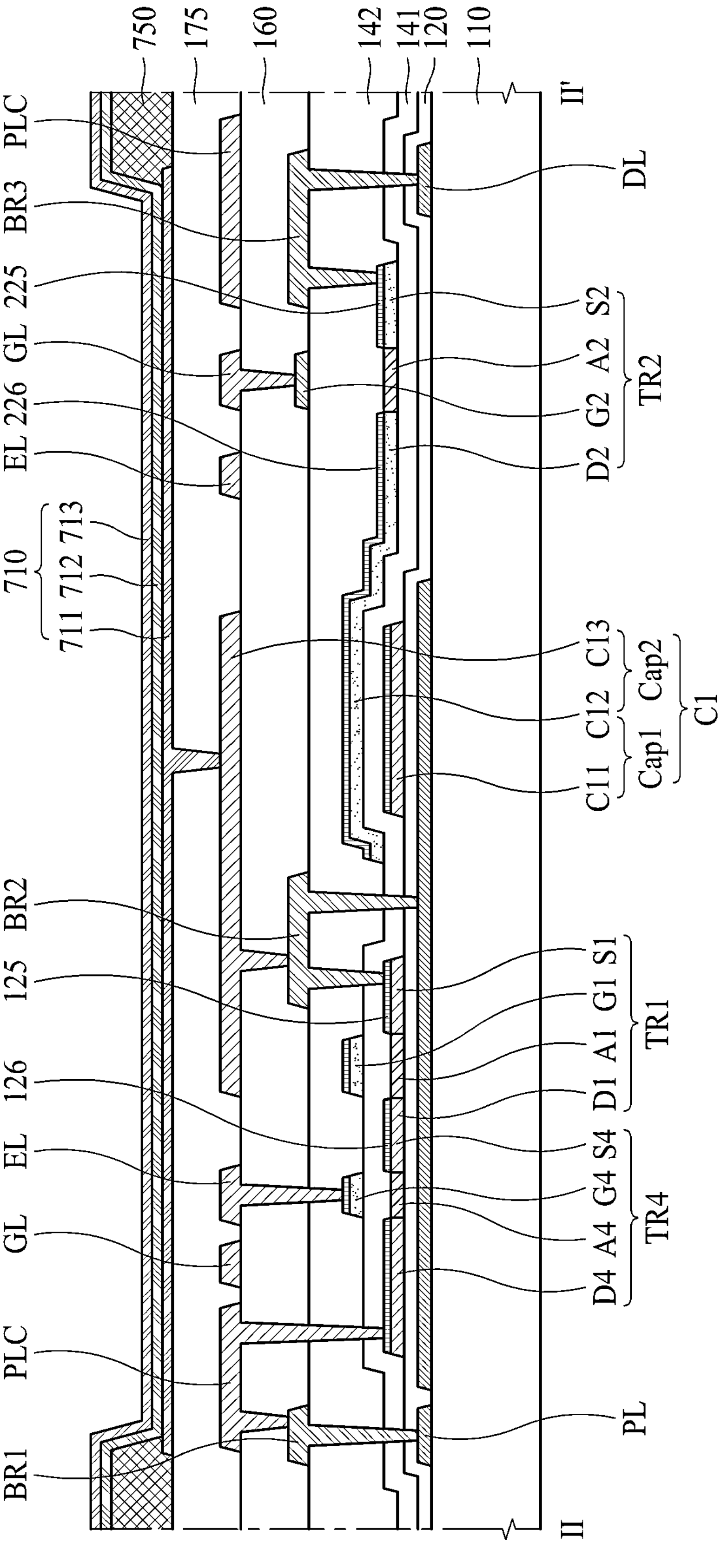
FIG. 16 is a cross-sectional view taken along line II-IF of FIG. 15.

FIG. 15 is a plan view illustrating the pixel of FIG. 14, and FIG. 16 is a cross-sectional view taken along line II-IF of FIG. 15.

Referring to FIGS. 15 and 16, the first thin film transistor TR1, the second thin film transistor TR2, the third thin film transistor TR3 and the fourth thin film transistor TR4 are disposed on the base substrate 110.

In detail, the data line DL, the driving power line PL and the first light shielding layer 111 are disposed on the base substrate 110.

The buffer layer 120 is disposed on the data line DL, the driving power line PL and the first light shielding layer 111.

The first active layer A1 of the first thin film transistor TR1, a third active layer of the third thin film transistor TR3 and a fourth active layer A4 of the fourth thin film transistor TR4 are disposed on the buffer layer 120. The first active layer A1, the third active layer and the fourth active layer A4 may be integrally formed.

The first conductive material layers 125 and 126 are disposed on the first active layer A1, the third active layer and the fourth active layer A4. The first conductive material layers 125 and 126 are not disposed on a first channel portion of the first active layer A1, a third channel portion of the third active layer and a fourth channel portion of the fourth active layer A4.

Referring to FIGS. 15 and 16, a portion of the first active layer A1 and the first conductive material layers 125 and 126 may form the first capacitor electrode C11 of the storage capacitor C1. For example, a stacked body comprised of the first source connection portion serving as the first source electrode S1 and the first conductive material layer 125 may serve as the first capacitor electrode C11.

A first gate insulating layer 141 is disposed on the first active layer A1, the third active layer, the fourth active layer A1 and the first conductive material layers 125 and 126.

The second active layer A2 of the second thin film transistor TR2 is disposed on the first gate insulating layer 141.

The second conductive material layers 225 and 226 are disposed on the second active layer A2. The second conductive material layers 225 and 226 are not disposed on the second channel portion of the second active layer A2.

Referring to FIGS. 15 and 16, a portion of the second active layer A2 and the second conductive material layers 225 and 226 may form the second capacitor electrode C12 of the storage capacitor C1. For example, a stacked body comprised of the second drain connection portion serving as the second drain electrode D2 and the second conductive material layer 226 may serve as the second capacitor electrode C12. The first capacitor Cap1 is formed by the first capacitor electrode C11 and the second capacitor electrode C12.

A first gate electrode G1, a third gate electrode G3 and a fourth gate electrode G4 are disposed on the first gate insulating layer 141. The first gate electrode G1, the third gate electrode and the fourth gate electrode G4 may be formed of a stacked body of the second active layer and the second conductive material layers 225 and 226.

The first gate electrode G1 may be integrally formed with the second capacitor electrode C12. The first gate electrode G1 may be integrally formed with a stacked body comprised of the second drain connection portion serving as the second drain electrode D2 and the second conductive material layer 226 in the second thin film transistor.

A second gate insulating layer 142 is disposed on the first gate electrode G1, the third gate electrode, the fourth gate electrode G4, the second active layer A2 and the second conductive material layers 225 and 226. The second gate insulating layer 142 may cover up to and including the entire upper surface of the second active layer A2.

The second gate electrode G2 of the second thin film transistor TR2 is disposed on the second gate insulating layer 142. Also, a first bridge BR1, a second bridge BR2 and a third bridge BR3 are disposed on the second gate insulating layer 142. The second gate electrode G2, the first bridge BR1, the second bridge BR2 and the third bridge BR3 may be made of the same material and by the same process.

The first bridge BR1 is connected to the driving power line PL through a contact hole.

The second bridge BR2 is connected to the first source electrode S1 formed in the first active layer A1 through the contact hole. The second bridge BR2 may be referred to as the first source electrode S1.

The second bridge BR2 is also connected to the first light shielding layer 111 through the contact hole.

The third bridge BR3 is connected to the second source electrode S2 formed in the second active layer A2 through the contact hole. The third bridge BR3 may be referred to as the second source electrode S2. Further, the third bridge BR3 is connected to the data line DL through the contact hole.

An interlayer insulating layer 160 is disposed on the second gate electrode G2, the first bridge BR1, the second bridge BR2 and the third bridge BR3.

Signal lines and a third capacitor electrode C13 are formed on the interlayer insulating layer 160.

In detail, a driving power connection line PLC, the gate line GL, the emission control line EL, the sensing control line SCL, the reference line RL and the third capacitor electrode C13 are disposed on the interlayer insulating film 160.

The driving power connection line PLC is connected to the first bridge BR1 through the contact hole, and is connected to the fourth drain electrode D4 formed in the fourth active layer A4 through another contact hole H2.

The gate line GL is connected to the second gate electrode G2 through the contact hole.

The light emission control line EL is connected to the fourth gate electrode G4 through the contact hole.

The sensing control line SCL is connected to a gate electrode of the third thin film transistor TR3 through the contact hole.

The reference line RL is connected to the active layer of the third thin film transistor TR3 through the contact hole.

The third capacitor electrode C13 is connected to the second bridge BR2. The third capacitor electrode C13 may be connected to the first thin film transistor TR1 through the second bridge BR2.

The second capacitor Cap2 is formed by the second capacitor electrode C13 and the second capacitor electrode C12. The storage capacitor C1 is formed by the first capacitor Cap1 and the second capacitor Cap2.

The planarization layer 175 is disposed on the driving power connection line PLC, the gate line GL, the emission control line EL, the sensing control line SCL, the reference line RL and the third capacitor electrode C13.

The first electrode 711 of the display element 710 is disposed on the planarization layer 175. The first electrode 711 of the display element 710 contacts the third capacitor electrode C13 connected to the second bridge BR2 through the contact hole formed in the planarization layer 175. As a result, the first electrode 711 may be connected to the first source electrode S1 of the first thin film transistor TR1.

The bank layer 750 is disposed at the edge of the first electrode 711. The bank layer 750 defines a light emission area of the display element 710.

The organic light emitting layer 712 is disposed on the first electrode 711, and the second electrode 713 is disposed on the organic light emitting layer 712 to form the display element 710. The display element 710 shown in FIG. 16 is an organic light emitting diode (OLED). Therefore, the display device 1100 according to one embodiment of the present disclosure is an organic light emitting display device.

According to the present disclosure, the following advantageous effects may be obtained.

According to one embodiment of the present disclosure, an active layer of a thin film transistor may be used as a gate electrode of another thin film transistor to improve space efficiency/save space/maximize the use of space. Therefore, a sufficient capacitor area may be released, in part from the space saved, in the thin film transistor substrate and the display device.

Also, according to one embodiment of the present disclosure, an aperture ratio of the display device may be improved.

The following numbered clauses are also disclosed:

1. A thin film transistor substrate comprising a first thin film transistor and a second thin film transistor on a base substrate, wherein the first thin film transistor includes: a first active layer on the base substrate; a first conductive material layer on the first active layer; and a first gate electrode spaced apart from the first active layer and at least partially overlapped with the first active layer, the second thin film transistor includes: a second active layer on the base substrate; a second conductive material layer on the second active layer; and a second gate electrode spaced apart from the second active layer and at least partially overlapped with the second active layer, the first active layer is disposed between the base substrate and the second active layer, the second active layer is disposed between the first active layer and the second gate electrode, and the first gate electrode is disposed on the same layer as the second active layer.

2. The thin film transistor substrate of clause 1, wherein the first gate electrode includes a first layer and a second layer on the first layer, the first layer of the first gate electrode is disposed on the same layer as the second active layer and includes the same semiconductor material as that of the second active layer, and the second layer of the first gate electrode is disposed on the same layer as the second conductive material layer and includes the same conductive material as that of the second conductive material layer.

3. The thin film transistor substrate of clause 2, wherein the first layer of the first gate electrode is integrally formed with the second active layer.

4. The thin film transistor substrate of clause 2 or 3, wherein the second layer of the first gate electrode is integrally formed with the second conductive material layer.

5. The thin film transistor substrate of any one of the preceding clauses, wherein each of the first and second conductive material layers includes at least one selected from titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO).

6. The thin film transistor substrate of any one of the preceding clauses, wherein the first active layer includes: a first channel portion; a first source connection portion connected to one side of the first channel portion; and a first drain connection portion connected to the other side of the first channel portion, and the first conductive material layer is disposed on the first source connection portion and the first drain connection portion, but is not disposed on the first channel portion.

7. The thin film transistor substrate of clause 6, wherein each of the first source connection portion and the first drain connection portion is disposed between the base substrate and the first conductive material layer.

8. The thin film transistor substrate of clause 6 or 7, wherein each of the first source connection portion and the first drain connection portion is in contact with the first conductive material layer.

9. The thin film transistor substrate of any one of the preceding clauses, wherein the second active layer includes: a second channel portion; a second source connection portion connected to one side of the second channel portion; and a second drain connection portion connected to the other side of the second channel portion, and the second conductive material layer is disposed on the second source connection portion and the second drain connection portion but is not disposed on the second channel portion.

10. The thin film transistor substrate of clause 9, wherein each of the second source connection portion and the second drain connection portion is disposed between the first active layer and the second conductive material layer.

11. The thin film transistor substrate of clause 9 or 10, wherein each of the second source connection portion and the second drain connection portion is in contact with the second conductive material layer.

12. The thin film transistor substrate of any one of clauses 9-11, wherein a portion of any one of the second source connection portion and the second drain connection portion constitutes the first layer of the first gate electrode.

13. The thin film transistor substrate of any one of clauses 9-12, further comprising:

a first capacitor electrode connected to any one of the first source connection portion and the first drain connection portion; and a second capacitor electrode connected to any one of the second source connection portion and the second drain connection portion, wherein the first capacitor electrode and the second capacitor electrode are spaced apart from each other and overlap each other to form a first capacitor.

14. The thin film transistor substrate of clause 13, wherein the first capacitor electrode includes a first layer integrally formed with any one of the first source connection portion and the first drain connection portion, and a second layer integrally formed with the first conductive material layer, and the second capacitor electrode includes a first layer integrally formed with any one of the second source connection portion and the second drain connection portion, and a second layer integrally formed with the second conductive material layer.

15. The thin film transistor substrate of clause 13 or 14, further comprising a third capacitor electrode disposed on the same layer as the second gate electrode, wherein the second capacitor electrode and the third capacitor electrode are spaced apart from each other and overlap each other to form a second capacitor.

16. The thin film transistor substrate of clause 15, wherein the second capacitor electrode is disposed between the first capacitor electrode and the third capacitor electrode, and the third capacitor electrode is connected to the first capacitor electrode.

17. The thin film transistor substrate of any one of the preceding clauses, further comprising a shielding layer disposed on the same layer as the second gate electrode and overlapped with the first gate electrode.

18. The thin film transistor substrate of any one of the preceding clauses, wherein each of the first active layer and the second active layer includes an oxide semiconductor material.

19. The thin film transistor substrate of clause 18, wherein the oxide semiconductor material includes at least one of an IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based, or FIZO(FeInZnO)-based oxide semiconductor material.

20. The thin film transistor substrate of any one of clauses 1-17, wherein at least one of the first active layer or the second active layer includes: a first oxide semiconductor layer; and a second oxide semiconductor layer on the first oxide semiconductor layer.

21. The thin film transistor substrate of clause 20, wherein at least one of the first active layer or second active layer further includes a third oxide semiconductor layer on the second oxide semiconductor layer.

22. The thin film transistor substrate of any one of the preceding claims, wherein the first conductive material layer does not overlap the first gate electrode.

23. The thin film transistor substrate of any one of the preceding claims, wherein the second conductive material layer does not overlap the second gate electrode.

24. A display device comprising the thin film transistor substrate of any one of clauses 1 to 23.

25. The thin film transistor substrate of any one of clauses 9-12, wherein a portion of the second conductive material layer disposed on any one of the second source connection portion and the second drain connection portion constitutes the second layer of the first gate electrode.

It will be apparent to those skilled in the art that various modifications and variations can be made in the thin film transistor substrate and the display device comprising the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A thin film transistor substrate comprising a first thin film transistor and a second thin film transistor on a base substrate, wherein the first thin film transistor includes:

a first active layer on the base substrate;

a first conductive material layer on the first active layer; and a first gate electrode spaced apart from the first active layer and at least partially overlapping with the first active layer;

a first source electrode in contact with an upper surface portion of the first conductive material layer; and a first drain electrode in contact with another upper surface portion of the first conductive material layer, wherein the second thin film transistor includes:

a second active layer on the base substrate;

a second conductive material layer on the second active layer; and a second gate electrode spaced apart from the second active layer and at least partially overlapping with the second active layer;

a second source electrode in contact with an upper surface portion of the second conductive material layer; and a second drain electrode in contact with another upper surface portion of the second conductive material layer, wherein the first source electrode and the first drain electrode are formed of a different material than the first conductive material layer;

wherein the second source electrode and the second drain electrode are formed of a different material than the second conductive material layer;

wherein the first active layer being is disposed between the base substrate and the second active layer, wherein the second active layer beings is disposed between the first active layer and the second gate electrode, wherein the first gate electrode being is disposed on the same layer as the second active layer, wherein the first active layer includes:

a first channel portion;

a first source connection portion connected to one side of the first channel portion;

a first drain connection portion connected to the other side of the first channel portion, and the first conductive material layer is disposed on the first source connection portion and the first drain connection portion, and is not disposed on the first channel portion, wherein the second active layer includes:

a second channel portion;

a second source connection portion connected to one side of the second channel portion;

a second drain connection portion connected to the other side of the second channel portion, and the second conductive material layer is disposed on the second source connection portion and the second drain connection portion and is not disposed on the second channel portion, and wherein each of the second source connection portion and the second drain connection portion is disposed between the first active layer and the second conductive material layer.

2. The thin film transistor substrate of claim 1, wherein the first gate electrode includes a first layer and a second layer on the first layer, the first layer of the first gate electrode is disposed on the same layer as the second active layer and includes a same semiconductor material as that of the second active layer, and the second layer of the first gate electrode is disposed on the same layer as the second conductive material layer and includes a same conductive material as that of the second conductive material layer.

3. The thin film transistor substrate of claim 2, wherein the first layer of the first gate electrode is integrally formed with the second active layer.

4. The thin film transistor substrate of claim 2, wherein the second layer of the first gate electrode is integrally formed with the second conductive material layer.

5. The thin film transistor substrate of claim 1, wherein each of the first and second conductive material layers includes at least one selected from titanium (Ti), molybdenum (Mo), aluminum (Al), silver (Ag), copper (Cu), chromium (Cr), tantalum (Ta), neodymium (Nd), calcium (Ca), barium (Ba) or a transparent conductive oxide (TCO).

6. The thin film transistor substrate of claim 1, wherein each of the first source connection portion and the first drain connection portion is disposed between the base substrate and the first conductive material layer.

7. The thin film transistor substrate of claim 1, wherein each of the first source connection portion and the first drain connection portion is in contact with the first conductive material layer.

8. The thin film transistor substrate of claim 1, wherein each of the second source connection portion and the second drain connection portion is in contact with the second conductive material layer.

9. The thin film transistor substrate of claim 1, wherein a portion of any one of the second source connection portion and the second drain connection portion constitutes the first layer of the first gate electrode.

10. The thin film transistor substrate of claim 1, wherein a portion of the second conductive material layer disposed on any one of the second source connection portion and the second drain connection portion constitutes the second layer of the first gate electrode.

11. The thin film transistor substrate of claim 1, further comprising:

a first capacitor electrode connected to any one of the first source connection portion and the first drain connection portion; and a second capacitor electrode connected to any one of the second source connection portion and the second drain connection portion, wherein the first capacitor electrode and the second capacitor electrode are spaced apart from each other and overlap each other to form a first capacitor.

12. The thin film transistor substrate of claim 11, wherein the first capacitor electrode includes a first layer integrally formed with any one of the first source connection portion and the first drain connection portion, and a second layer integrally formed with the first conductive material layer, and the second capacitor electrode includes a first layer integrally formed with any one of the second source connection portion and the second drain connection portion, and a second layer integrally formed with the second conductive material layer.

13. The thin film transistor substrate of claim 11, further comprising a third capacitor electrode disposed on the same layer as the second gate electrode, wherein the second capacitor electrode and the third capacitor electrode are spaced apart from each other and overlap each other to form a second capacitor.

14. The thin film transistor substrate of claim 13, wherein the second capacitor electrode is disposed between the first capacitor electrode and the third capacitor electrode, and the third capacitor electrode is connected to the first capacitor electrode.

15. The thin film transistor substrate of claim 1, further comprising a shielding layer disposed on the same layer as the second gate electrode and overlapped with the first gate electrode.

16. The thin film transistor substrate of claim 1, wherein each of the first active layer and the second active layer includes an oxide semiconductor material.

17. The thin film transistor substrate of claim 16, wherein the oxide semiconductor material includes at least one of an IZO(InZnO)-based, IGO(InGaO)-based, ITO(InSnO)-based, IGZO(InGaZnO)-based, IGZTO(InGaZnSnO)-based, GZTO(GaZnSnO)-based, GZO(GaZnO)-based, ITZO(InSnZnO)-based, or FIZO(FeInZnO)-based oxide semiconductor material.

18. The thin film transistor substrate of claim 1, wherein at least one of the first active layer or the second active layer includes:

a first oxide semiconductor layer; and a second oxide semiconductor layer on the first oxide semiconductor layer.

19. The thin film transistor substrate of claim 18, wherein at least one of the first active layer or second active layer further includes a third oxide semiconductor layer on the second oxide semiconductor layer.

20. The thin film transistor substrate of claim 1, wherein the first conductive material layer does not overlap the first gate electrode.

21. The thin film transistor substrate of claim 1, wherein the second conductive material layer does not overlap the second gate electrode.

22. A display device comprising the thin film transistor substrate of claim 1.

23. The thin film transistor substrate of claim 1, wherein the first source electrode is connected to the first active layer by the first conductive material layer, wherein the first drain electrode is connected to the first active layer by the first conductive material layer, wherein the second source electrode is connected to the second active layer by the second conductive material layer, and wherein the second drain electrode is connected to the second active layer by the second conductive material layer.

24. The thin film transistor substrate of claim 1, further comprising a first gate insulating layer disposed between the first active layer and the first gate electrode, wherein the first gate electrode and the second active layer are directly on a same upper surface of the first gate insulating layer.

* * * * *